(12) United States Patent
Kunihiro

(10) Patent No.: US 9,531,327 B2
(45) Date of Patent: Dec. 27, 2016

(54) POWER AMPLIFIER AND POWER AMPLIFICATION METHOD

(71) Applicant: NEC CORPORATION, Tokyo (JP)

(72) Inventor: Kazuaki Kunihiro, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/434,137

(22) PCT Filed: Oct. 29, 2013

(86) PCT No.: PCT/JP2013/079252
§ 371 (c)(1),
(2) Date: Apr. 8, 2015

(87) PCT Pub. No.: WO2014/069451
PCT Pub. Date: May 8, 2014

(65) Prior Publication Data
US 2015/0263678 A1  Sep. 17, 2015

(30) Foreign Application Priority Data

Oct. 31, 2012  (JP) .................................. 2012-240005

(51) Int. Cl.
*H03F 3/68* (2006.01)
*H03F 1/02* (2006.01)
(Continued)

(52) U.S. Cl.
CPC .......... *H03F 1/0288* (2013.01); *H03F 1/0222* (2013.01); *H03F 1/0244* (2013.01);
(Continued)

(58) Field of Classification Search
CPC ............ H03F 1/07; H03F 1/0288; H03F 3/68; H03F 1/3252; H03F 1/06; H03F 3/24; H03F 3/60; H04L 5/00; H04L 27/26
(Continued)

(56) References Cited

U.S. PATENT DOCUMENTS 7,342,444 B2 * 3/2008 Kim .................. H03F 1/0288
330/124 R
2009/0179703 A1 7/2009 Takenaka
(Continued)

FOREIGN PATENT DOCUMENTS

JP  2007-53540 A  3/2007
JP  2009-94803 A  4/2009
(Continued)

OTHER PUBLICATIONS

J. Staudinger et al., "High Efficiency CDMA RF Power Amplifier Using Dynamic Envelope Tracking Technique", IEEE MTT-S Digest, 2000, pp. 873-876, WE3A-6, vol. 2.
(Continued)

*Primary Examiner* — Steven J Mottola
*Assistant Examiner* — Hafizur Rahman
(74) *Attorney, Agent, or Firm* — Sughrue Mion, PLLC

(57) ABSTRACT

When frequency allocation for a plurality of frequencies is in an intra-band CA relationship, a first amplifier is operated in class B, a second amplifier is operated in class C, and a power modulator is caused to supply a constant voltage to the first and second amplifiers so as to operate as a Doherty-type power amplifier. In addition, when the frequency allocation for the plurality of frequencies is in an inter-band non-contiguous CA relationship, the first and second amplifiers are operated in class B, and the power modulator is caused to supply a voltage proportional to the amplitude component of an input signal to the first and second amplifiers so as to operate as a power amplifier based on an ET system.

14 Claims, 15 Drawing Sheets

(51) Int. Cl.
*H03F 3/24* (2006.01)
*H03F 3/60* (2006.01)
*H03F 1/42* (2006.01)
*H03F 1/56* (2006.01)
*H03F 3/19* (2006.01)
*H03F 3/21* (2006.01)

(52) U.S. Cl.
CPC ............... *H03F 1/42* (2013.01); *H03F 1/56* (2013.01); *H03F 3/19* (2013.01); *H03F 3/211* (2013.01); *H03F 3/24* (2013.01); *H03F 3/601* (2013.01); *H03F 2200/102* (2013.01); *H03F 2200/111* (2013.01); *H03F 2200/451* (2013.01); *H03F 2203/21106* (2013.01)

(58) Field of Classification Search
USPC   330/84, 86, 124 R, 126, 130, 295; 333/117, 122, 124, 204, 205, 219, 248; 341/180, 181; 375/260, 261, 269, 273, 297, 375/298, 312, 318, 335; 455/59, 176.1, 194.2, 455/195.1, 282, 333, 341, 464, 127.1, 143; 379/338, 443
See application file for complete search history.

(56) References Cited

U.S. PATENT DOCUMENTS

2011/0222444 A1\*  9/2011  Khlat ..................... H03F 3/189
                                                         370/277
2011/0285460 A1    11/2011  Murao

FOREIGN PATENT DOCUMENTS

JP        2009-171147 A       7/2009
WO        2010/084544 A1      7/2010

OTHER PUBLICATIONS

Nobuhiko Miki et al., "Carrier Aggregation for achieving broadband in LTE-Advanced", NTT DOCOMO Technical Journal, Jul. 2010, pp. 12-21, vol. 18, No. 2.

International Search Report for PCT/JP2013/079252 dated Jan. 14, 2014.

\* cited by examiner

POWER AMPLIFIER AND POWER AMPLIFICATION METHOD

CROSS REFERENCE TO RELATED APPLICATIONS

This application is a National Stage of International Application No. PCT/JP2013/079252 filed Oct. 29, 2013, claiming priority based on Japanese Patent Application No. 2012-240005, filed Oct. 31, 2012, the contents of all of which are incorporated herein by reference in their entirety.

TECHNICAL FIELD

The present invention relates to a power amplifier and a power amplification method for amplifying a RF (Radio Frequency) signal including signals of a plurality of frequency bands used in wireless communication.

BACKGROUND ART

In a transmission device used in wireless communication, in many cases, the PA (power amplifier) for amplifying the RF (Radio Frequency) signal to be transmitted consumes largest amount of power. Thus, in the development of transmission devices, reduction of the power consumption of the power amplifier, in other words, improvement of the power efficiency of the power amplifier, is an important task. In a recent wireless communication system, a digital modulation system such as QPSK (Quadrature Phase Shift Keying) or multi-valued QAM (Quadrature Amplitude Modulation) is employed to improve spectrum efficiency. In such a digital modulation system, to transfer data without any errors, high linearity is required of the input/output characteristics of the power amplifier.

Thus, in the power amplifier, to maintain the linearity of the input/output characteristics, average output power is set so that instantaneous maximum output (peak) power can be equal to or lower than saturated output power. In other words, in the power amplifier, since the ratio of the peak power and the average power of the RF signal to be amplified (Peak-to-Average Power Ratio, referred to as PAR hereinafter) is larger, the average output power must be set lower than the saturated output power.

In general, however, in the power amplifier, since the average output power is set lower than the saturated output power, the ratio of power acquired from the power amplifier to power supplied to the power amplifier, in other words, power efficiency, is lower. The reduction of the power efficiency of the power amplifier increases the power consumption of the transmission device, and consequently recent market demand for reduced of power consumption has not been satisfied.

Normally, the PAR of the RF signal has a unique value for each wireless communication standard. In a communication system such as CDMA (Code Division Multiple Access) or LTE (Long Term Evolution) employed in a recent mobile communication system, or a wireless communication standard employed in WLAN (Wireless Local Area Network) or terrestrial digital broadcasting, the PAR of the RF signal is set to a large value from several dB to several tens of dB.

The large PAR of the RF signal to be amplified causes great reduction of the power efficiency of the power amplifier. Consequently, the power consumption of the entire transmission device including the power amplifier increases.

As a technology for improving power efficiency in the power amplifier of the low average output power, an ET (Envelope Tracking) system is known. The configuration example of the ET system is described in, for example, Non-patent Document 1.

FIG. 1 is a block diagram illustrating the configuration example of the power amplifier based on the ET system.

As illustrated in FIG. 1, the power amplifier of the ET system includes amplifier 21 and power modulator 22. RF modulation signal 26 having amplitude and phase components is input to amplifier 21. Power modulator 22 modulates a power supply voltage $V_{DD}$ by using the amplitude component of RF modulation signal 26 as control signal 27, and supplies the modulated voltage to the power terminal of amplifier 21.

Amplifier 21 amplifies RF modulation signal 26 including the amplitude and phase components by using the output voltage of power modulator 22 as a power source, and outputs amplified RF modulation signal 28 via matching circuit 23.

In the power amplifier of the ET system illustrated in FIG. 1, when RF modulation signal 28 is at low output power, power modulator 22 reduces the power supply voltage supplied to amplifier 21, and thus power supplied to amplifier 21 is controlled to a necessary minimum to reduce the power consumption of amplifier 21.

As another technology for improving power efficiency in the power amplifier of the low average output power, there is a Doherty-type power amplifier.

FIG. 2 is a block diagram illustrating the configuration example of the Doherty-type power amplifier.

As illustrated in FIG. 2, the Doherty-type power amplifier includes carrier amplifier 31a that operates in class AB or B and peak amplifier 31b that operates in class C, and carrier and peak amplifiers 31a and 31b are connected in parallel.

RF modulation signal 36 having amplitude and phase components is divided to each of carrier and peak amplifiers 31a and 31b by power divider 35. At this time, RF modulation signal 36 is input from power divider 35 to peak amplifier 31b via transmission line 34b.

First matching circuit 33a and transmission line 34a are connected in series to the output end of carrier amplifier 31a, and second matching circuit 33b is connected to the output end of peak amplifier 31b. Transmission lines 34a and 34b have lengths X/4 (X corresponding to wavelength of carrier frequency) and characteristic impedance $Z_0$. The output ends of transmission line 34a and second matching circuit 33b are connected to each other, and a signal (RF modulation signal 38) combining the output signals of carrier and peak amplifiers 31a and 31b is supplied to load $R_L$.

In the Doherty-type power amplifier illustrated in FIG. 2, when the amplitude r of RF modulation signal 38 is small ($r \leq \frac{1}{2} \cdot V_{max}$; $V_{max}$ is maximum amplitude), only carrier amplifier 31a is operated, and power efficiency is largest, theoretically 78.5%, at $r = \frac{1}{2} \cdot V_{max}$. At this time, the impedance of a load ($R_L = Z_0/2$) seen from first matching circuit 33a is $2Z_0$ because transmission line 34a operates as an impedance transformer. Thus, the output power of the Doherty-type power amplifier illustrated in FIG. 2 is $V_{DD}^2/4Z_0 = 0.5 P_{max}$ ($P_{max} = V_{DD}^2/2Z_0$; $V_{DD}$ is power supply voltage of carrier amplifier 31a). First matching circuit 33a matches the impedance $2Z_0$ of the load and the output impedance of carrier amplifier 31a with each other.

On the other hand, when the amplitude r of RF modulation signal 38 exceeds $\frac{1}{2} \cdot V_{max}$, carrier and peak amplifiers 31a and 31b are both operated. In other words, at $\frac{1}{2} \cdot V_{max} < r \leq V_{max}$, since power is also supplied to the load from peak amplifier 31b, the impedance of the load changes from $Z_0/2$ to $Z_0$ due to a load pull effect. Further, since transmission line 34a operates as the impedance transformer, the impedance of the load seen from first matching circuit 33a also changes from $2Z_0$ to $Z_0$. Accordingly, in the Doherty-type power amplifier illustrated in FIG. 2, at $r=V_{max}$, a power output is maximum Pmax ($=V_{DD}^2/2Z_0$).

First matching circuit 33a is designed to match, even when the impedance of the load is $Z_0$, the impedance $Z_0$ of the load and the output impedance of carrier amplifier 31a with each other. In this case, since carrier and peak amplifiers 31a and 31b both output power $P_{max}$, the output of the entire Doherty-type power amplifier is $2P_{max}$. Further, carrier and peak amplifiers 31a and 31b both operate in saturation, and accordingly the efficiency of the entire power amplifier is 78.5%. In other words, in the Doherty-type power amplifier, since power efficiency when the amplitude of the output signal is $\frac{1}{2} \cdot V_{max}$ (corresponding to 6 dB back-off in the case of power) is improved, power consumption at a low output can be reduced.

Concerning the recent wireless communication standard, to achieve much faster wireless communication, a study has been conducted on CA (Carrier Aggregation) technology that uses a plurality of fragmented (discontinuous) frequency bands for transferring one signal. The CA technology is described in, for example, Non-patent Document 2.

In the wireless communication system employing the CA technology, since the frequency bands usable for data transmission increases, a much higher transmission speed can be achieved.

In the wireless communication system employing the CA technology, in the case of frequency allocation where carrier frequencies are greatly separated from each other (when difference $\Delta f$ between carrier frequencies is sufficiently larger than modulation band width $f_{BB}$ of each carrier frequency: inter-band non-contiguous CA), communication is carried out by simultaneously using a plurality of carrier frequencies having different transmission characteristics, and thus communication stability can be improved.

Further, the application of the CA technology enables communication even when frequency bands are allocated in fragments to a plurality of business operators or when a frequency band is shared among the plurality of business operators.

In the wireless communication system employing the aforementioned CA technology, a transmission device for transmitting a RF signal of a plurality of frequency bands (bands) is necessary. Even such a transmission device is required to reduce power consumption.

Typically, the characteristics of the power amplifier strongly depend on the frequency of the RF signal to be amplified. Accordingly, to achieve a transmission device compatible with the aforementioned CA technology, a configuration where a dedicated power amplifier is provided for each used frequency band is generally employed.

FIG. 3 illustrates the configuration example of a transmission device which uses two frequencies $f_1$ and $f_2$ as carrier frequencies and to which the CA technology is applied according to the background art.

The transmission device illustrated in FIG. 3 is configured by including first power amplifier 41 for amplifying and outputting RF signal 46a of the carrier frequency $f_1$, second power amplifier 42 for amplifying and outputting RF signal 46b of the carrier frequency $f_2$, combiner 44 for combining the output signals of first and second power amplifiers 41 and 42, and broadband antenna 45 corresponding to the carrier frequencies $f_1$ and $f_2$.

For first and second power amplifiers 41 and 42 illustrated in FIG. 3, to reduce the power consumption of the entire transmission device, the power amplifier of the ET system illustrated in FIG. 1 or the Doherty-type power amplifier illustrated in FIG. 2 is preferably used.

As described above, the characteristics of the power amplifier used in the transmission device exhibit strong frequency dependence. Accordingly, to reduce the power consumption while realizing a transmission device compatible with the aforementioned CA technology, a configuration where a dedicated power amplifier is provided for each used frequency band is generally employed as illustrated in FIG. 3.

However, such a transmission device has a problem of a size increase due to the necessity of including a plurality of power amplifiers.

In the transmission device of the background art illustrated in FIG. 3, when the used carrier frequency is changed, a new power amplifier optimally designed to correspond to the changed carrier frequency must be provided. This creates a problem of inability to flexibly deal with the carrier frequency change.

RELATED ART DOCUMENTS

Non-Patent Document

Non-patent Document 1: pp. 873 to 876, FIG. 1, IEEE, MTT-S Digest, Vol. 2, 2000

Non-patent Document 2: "Carrier Aggregation for achieving broadband in LTE-Advanced" by Nobuhiko Miki, et al, NTT DoCoMo technical journal Vol. 18, No. 2

SUMMARY

It is therefore an object of the present invention to provide a power amplifier and a power amplification method capable of simultaneously amplifying signals of a plurality of frequency bands, having high power efficiency, and capable of flexibly dealing with a change in the frequency band that is used.

In order to achieve the above object, a power amplifier according to an exemplary aspect of the present invention includes:

a power divider for distributing an input signal including a plurality of carrier frequencies to two amplifiers;

a first amplifier for amplifying and outputting one of the signals divided by the power divider;

a first transmission line having a length equivalent to a ¼ wavelength of the carrier frequency included in the input signal;

a second amplifier for receiving the other signal divided by the power divider via the first transmission line and amplifying and outputting the other signal;

a power modulator for supplying a power supply voltage to the first and second amplifiers;

a first matching circuit connected to an output end of the first amplifier and configured to match output impedance of the first amplifier with impedance of a load;

a second matching circuit connected to an output end of the second amplifier and configured to match output impedance of the second amplifier with the impedance of the load;

a second transmission line having a length equivalent to a ¼ wavelength of the carrier frequency, one end connected to an output end of the first matching circuit, and the other end connected to an output end of the second matching circuit, and configured to supply a synthesized signal of output signals of the first and second amplifiers to the load from the other end; and a control unit configured to set operation classes of the first and second amplifiers and supply a control signal for controlling the power supply voltage supplied to the first and second amplifiers to the power modulator.

Another power amplifier according to an exemplary aspect of the present invention includes:

a power divider for distributing an input signal including a plurality of carrier frequencies to three amplifiers;

a first amplifier for amplifying and outputting a first signal divided by the power divider;

a first transmission line having a length equivalent to a ¼ wavelength of the carrier frequency included in the input signal;

a second transmission line having a length equivalent to a ½ wavelength of the carrier frequency included in the input signal;

a second amplifier for receiving a second signal divided by the power divider via the first transmission line and amplifying and outputting the second signal;

a third amplifier for receiving a third signal divided by the power divider via the second transmission line and amplifying and outputting the third signal;

a power modulator for supplying a power supply voltage to the first, second and third amplifiers;

a first matching circuit connected to an output end of the first amplifier and configured to match output impedance of the first amplifier with impedance of a load;

a second matching circuit connected to an output end of the second amplifier and configured to match output impedance of the second amplifier with the impedance of the load;

a third matching circuit connected to an output end of the third amplifier and configured to match output impedance of the third amplifier with the impedance of the load;

a third transmission line having one end connected to an output end of the first matching circuit, and the other end connected to an output end of the second matching circuit;

a fourth transmission line having a length equivalent to a ¼ wavelength of the carrier frequency, one end connected to the output end of the second matching circuit, and the other end connected to an output end of the third matching circuit, and configured to supply a synthesized signal of output signals of the first, second and third amplifiers to the load from the other end; and a control unit configured to set operation classes of the first, second and third amplifiers and supply a control signal for controlling the power supply voltage supplied to the first, second and third amplifiers to the power modulator.

A power amplification method according to an exemplary aspect of the present invention includes first and second amplifiers connected in parallel and configured to amplify and output an input signal that includes a plurality of carrier frequencies, the method executed by a computer, comprising:

when frequency allocation of the plurality of carrier frequencies is in an intra-band carrier aggregation relationship, operating the first amplifier in class B while operating the second amplifier in class C, and supplying a predetermined constant voltage as a power supply voltage from a power modulator to the first and second amplifiers, thereby operating the first and second amplifiers as Doherty-type power amplifiers; and when the frequency allocation of the plurality of carrier frequencies is in an inter-band non-contiguous carrier aggregation relationship, operating the first and second amplifiers in class B, and supplying a voltage proportional to an amplitude component of the input signal as the power supply voltage from the power modulator to the first and second amplifiers, thereby operating the first and second amplifiers as power amplifiers based on an Envelope Tracking system.

Another power amplification method according to an exemplary aspect of the present invention includes first, second, and third amplifiers connected in parallel and configured to amplify and output an input signal that includes a plurality of carrier frequencies, the method executed by a computer, comprising:

when frequency allocation of the plurality of carrier frequencies is in an intra-band carrier aggregation relationship, operating the first amplifier in class B while operating the second and third amplifiers in class C, and supplying a predetermined constant voltage as a power supply voltage from a power modulator to the first, second and third amplifiers, thereby operating the first, second and third amplifiers as Doherty-type power amplifiers; and when the frequency allocation of the plurality of carrier frequencies is in an inter-band non-contiguous carrier aggregation relationship, operating the first, second, and third amplifiers in class B, and supplying a voltage proportional to an amplitude component of the input signal as the power supply voltage from the power modulator to the first, second, and third amplifiers, thereby operating the first, second and third amplifiers as power amplifiers based on an Envelope Tracking system.

Effects of Invention

According to the present invention, a power amplifier capable of simultaneously amplifying signals of a plurality of frequency bands, having high power efficiency, and capable of flexibly dealing with the change of a used frequency band is provided.

EXEMPLARY EMBODIMENT

Next, the present invention will be described with reference to the drawings.

First Exemplary Embodiment

Figure 4:
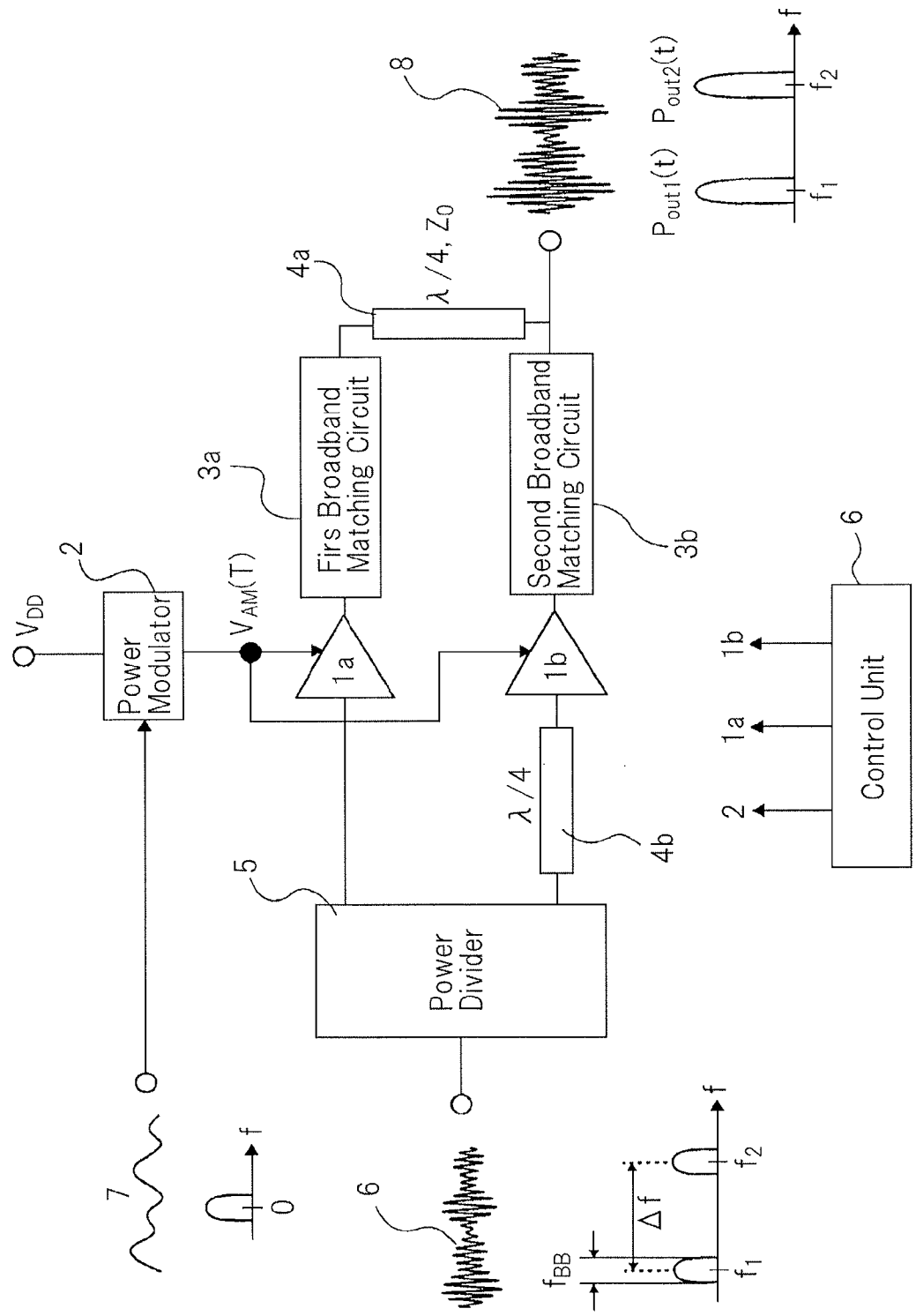
FIG. 4 is a block diagram illustrating the configuration example of a power amplifier according to a first exemplary embodiment.

FIG. 4 is a block diagram illustrating the configuration example of a power amplifier according to a first exemplary embodiment.

As illustrated in FIG. 4, the power amplifier according to the first exemplary embodiment includes first amplifier 1a, second amplifier 1b, power modulator 2, first broadband matching circuit 3a, second broadband matching circuit 3b, transmission lines 4a and 4b, power divider 5, and control unit 6.

Power divider 5 equally divides an input signal (RF modulation signal 6) including a plurality of carrier frequencies $f_1$ and $f_2$ to first amplifier 1a and transmission line 4b.

First amplifier 1a amplifies and outputs one of the signals divided by power divider 5. Second amplifier 1b receives the other signal divided by power divider 5 via transmission line 4b, and amplifies and outputs the other signal.

Power modulator 2 supplies a predetermined power supply voltage to first and second amplifiers 1a and 1b.

First broadband matching circuit 3a is a circuit connected to the output end of first amplifier 1a and configured to match the output impedance of first amplifier 1a with the impedance of load $R_L$. Second broadband matching circuit 3b is a circuit connected to the output end of second amplifier 1b and configured to match the output impedance of second amplifier 1b with the impedance of the load $R_L$.

Control unit 6 sets the operation classes of first and second amplifiers 1a and 1b, and supplies a control signal for controlling the power supply voltage supplied to first and second amplifiers 1a and 1b to power modulator 2. Control unit 6 may be commonly used as a control unit included in a transmission device and configured to control the operation of the entire transmission device, or may be independently provided.

RF modulation signal 6 including the two carrier frequencies $f_1$ and $f_2$ ($f_2 > f_1$, $\Delta f = f_2 - f_1$) is input to the power amplifier illustrated in FIG. 4. The modulation bandwidth (baseband bandwidth) of each carrier frequency is $f_{BB}$. Transmission lines 4a and 4b are lines each having a length $\lambda/4$ ($\lambda$ is, for example, wavelength of carrier frequency $f_1$), and characteristic impedance $Z_0$ at the carrier frequencies $f_1$ and $f_2$.

RF modulation signal 6 is divided to first and second amplifiers 1a and 1b by power divider 5. At this time, RF modulation signal 6 is divided to second amplifier 1b from power divider 5 via transmission line 4b.

First broadband matching circuit 3a and transmission line 4a are connected in series to the output end of first amplifier 1a, and second broadband matching circuit 3b is connected to the output end of second amplifier 1b. The output ends of transmission line 4a and second broadband matching circuit 3b connected to each other, and RF modulation signal 8 combining the output signals of first and second amplifiers 1a and 1b is output from the connection node.

Power modulator 2 supplies a predetermined constant voltage to the power terminals of first and second amplifiers 1a and 1b when the aforementioned modulation bandwidth $f_{BB}$ and the interval $\Delta f$ are approximately equal to each other (hereinafter, referred to as intra-band CA). When the aforementioned interval $\Delta f$ is sufficiently larger than the modulation bandwidth $f_{BB}$ (hereinafter, referred to as inter-band non-contiguous CA), power modulator 2 modulates the power supply voltage $V_{DD}$ according to control signal 7 that is the amplitude component of RF modulation signal 6, and supplies the modulated voltage to the power terminals of first and second amplifiers 1a and 1b.

The intra-band CA indicates frequency allocation on the assumption that communication is carried out by using, for example, a plurality of continuous frequency bands larger than a modulation bandwidth (e.g., 20 MHz) or a plurality of discontinuous frequency bands (note that frequency bands are relatively close to each other). The inter-band non-contiguous CA indicates frequency allocation on the assumption that communication is carried out by using a plurality of carriers in which frequency bands are fragmented (not continuous but relatively separated).

As described above, the modulation signal having an amplitude component $a_1(t)$ and a phase component $\theta_1(t)$ superimposed on the carrier frequency $f_1$ and the modulation signal having an amplitude component $a_2(t)$ and a phase component $\theta_2(t)$ superimposed on the carrier frequency $f_2$ are synthesized to be input to the power amplifier according to the exemplary embodiment. At this time, the amplitude $V(t)$ of the input signal is represented by the following formula (1).

[Mathematical expression 1]

$$V(t) = a_1(t)\cos[2\pi f_1 t + \theta_1(t)] + a_2(t)\cos[2\pi f_2 t + \theta_2(t)] \quad (1)$$

In the formula, $f_{BB}$ is the bandwidth (baseband bandwidth) of each of the two modulation signals, and $\Delta f$ is an interval between the carrier frequencies $f_1$ and $f_2$.

When the modulation bandwidth $f_{BB}$ and the interval $\Delta f$ are approximately equal to each other (intra-band CA), the instantaneous power $P(t)$ of synthesized RF modulation signal 8 can be represented by the following formula (2). Note that R is load resistance.

[Mathematical expression 2]

$$P(t) = \frac{1}{2R}([a_1(t)]^2 + [a_2(t)]^2) + \frac{1}{R}a_1(t)a_2(t)\cos[2\pi\Delta f t + \theta_2(t) - \theta_1(t)] \quad (2)$$

The baseband bandwidth of synthesized RF modulation signal 8 represented by the formula (2) is indicated by the second term of a right side, namely, a phase interference term, and depends on an interval $\Delta f$ ($\approx f_{BB}$) between the two carrier frequencies $f_1$ and $f_2$ to be approximately $2 \times f_{BB}$.

Generally, when n modulation signals of the bandwidth $f_{BB}$ are arranged at intervals approximately equal to the bandwidth $f_{BB}$, the bandwidth of the synthesized signals thereof is approximately $n \times f_{BB}$.

In the power amplifier according to the exemplary embodiment, in such an intra-band CA, first amplifier 1a illustrated in FIG. 4 is operated in class B (or AB) while second amplifier 1b is operated in class C. To operate first and second amplifiers 1a and 1b in class B, AB, or C, each operation point is only needs to be set according to the operation class.

In the power amplifier according to the exemplary embodiment, in the intra-band CA, a constant voltage ($V_{AM}$(t)=f constant) is supplied from power modulator 2 illustrated in FIG. 4 to first and second amplifiers 1a and 1b. By operating first and second amplifiers 1a and 1b and power modulator 2 in the aforementioned manner, the power amplifier illustrated in FIG. 4 is operated as a Doherty-type power amplifier in the intra-band CA.

The Doherty-type power amplifier exhibits frequency dependence because transmission line 4a is used as an impedance transformer. However, when the ratio (specific band) of the baseband bandwidth to the carrier frequency is approximately 10% or lower, the power amplifier illustrated in FIG. 4 can be regarded as the Doherty-type power amplifier.

Thus, in the power amplifier illustrated in FIG. 4, when the interval $\Delta f$ between the two carrier frequencies $f_1$ and $f_2$ is approximately equal to the baseband bandwidth $f_{BB}$, characteristics of the Doherty-type power amplifier can be acquired. In other words, in an output power region having 6 dB back-off, power efficiency is maximum, and the signal including the two carrier frequencies can be amplified with high power efficiency.

On the other hand, when the interval $\Delta f$ between the two carrier frequencies $f_1$ and $f_2$ is sufficiently larger than the baseband bandwidth $f_{BB}$ (inter-band CA), the instantaneous power P(t) of synthesized RF modulation signal 8 can be represented by the following formula (3).

[Mathematical expression 3]

$$P(t) = \frac{1}{2R}([a_1(t)]^2 + [a_2(t)]^2) \qquad (3)$$

In this case, the baseband bandwidth of the synthesized signal represented by the formula (3) is approximately equal to the baseband bandwidth $f_{BB}$ of each modulation signal without any dependence on the interval $\Delta f$ between the two carrier frequencies. One reason for this is that due to the relationship of $\Delta f \gg f_{BB}$, the frequency component indicated by the second term of the right side of the formula (2) is substantially attenuated before its entry to the amplifier since it sufficiently deviates from a desired frequency band, and can be time-averaged to be "0".

In the power amplifier according to the exemplary embodiment, in such a case, first and second amplifiers 1a and 1b illustrated in FIG. 4 are both operated in class B (or AB). As described above, to operate first and second amplifiers 1a and 1b in class B, AB, or C, each operation point is only needs to be set according to the operation class.

First broadband matching circuit 3a that is a broadband impedance conversion circuit is connected to the output end of first amplifier 1a, and second broadband matching circuit 3b that is a broadband impedance conversion circuit is connected to the output end of second amplifier 1b. First and second broadband matching circuits 3a and 3b match the output impedance of first and second amplifiers 1a and 1b with the impedance of the load in the two carrier frequencies $f_1$ and $f_2$. In this case, first and second amplifiers 1a and 1b serve as broadband B-class balance-type amplifiers.

Transmission lines 4a and 4b serve only as delay lines for the modulation signal of the carrier frequencies $f_1$ and $f_2$, and thus do not interfere with broadband operations. However, note that since the load fluctuation principle similar to that in the case of the Doherty type does not work, the power efficiency in the back-off region is maintained low as in the case of the B-class amplifier.

Thus, according to the exemplary embodiment, in the inter-band CA, a voltage $V_{AM}$ represented by the following formula (4) is output from power modulator 2.

[Mathematical expression 4]

$$V_{AM}(t) = C\sqrt{P_{out1}(t) + P_{out2}(t)} \qquad (4)$$

Here, $P_{out1}$(t) is the output power of the modulation signal of the carrier frequency $f_1$, $P_{out2}$(t) is the output power of the carrier frequency $f_2$, and C is a proportional constant. $V_{AM}$(t) is proportional to the amplitude of the signal combining the carrier frequencies $f_1$ and $f_2$. By operating first and second amplifiers 1a and 1b and power modulator 2 in the aforementioned manner, the power amplifier illustrated in FIG. 4 is operated as a power amplifier based on an ET system in the inter-band CA.

Generally, when the baseband bandwidth is very wide, the power amplifier of the ET system needs to output a modulated voltage $V_{AM}$(t) from power modulator 2 at a high speed. It is consequently difficult to realize power modulator 2 that will operate at high power efficiency. On the other hand, as indicated by formulas (3) and (4), in the case of $\Delta f \gg f_{BB}$, the baseband bandwidth $f_{BB}$ of the synthesized signal is approximately equal to that when the number of carrier frequencies is 1, and thus power modulator 2 that will operate at high power efficiency can be realized.

Thus, when the interval $\Delta f$ between the two carrier frequencies $f_1$ and $f_2$ is sufficiently larger than the baseband bandwidth $f_{BB}$, in the power amplifier illustrated in FIG. 4, characteristics of the power amplifier of the ET system can be acquired. In other words, in an output power region having back-off, a signal that includes the two carrier frequencies can be amplified with high power efficiency.

Next, the operation of the power amplifier according to the first exemplary embodiment will be described in detail referring to FIGS. 5 to 11.

Figure 5:
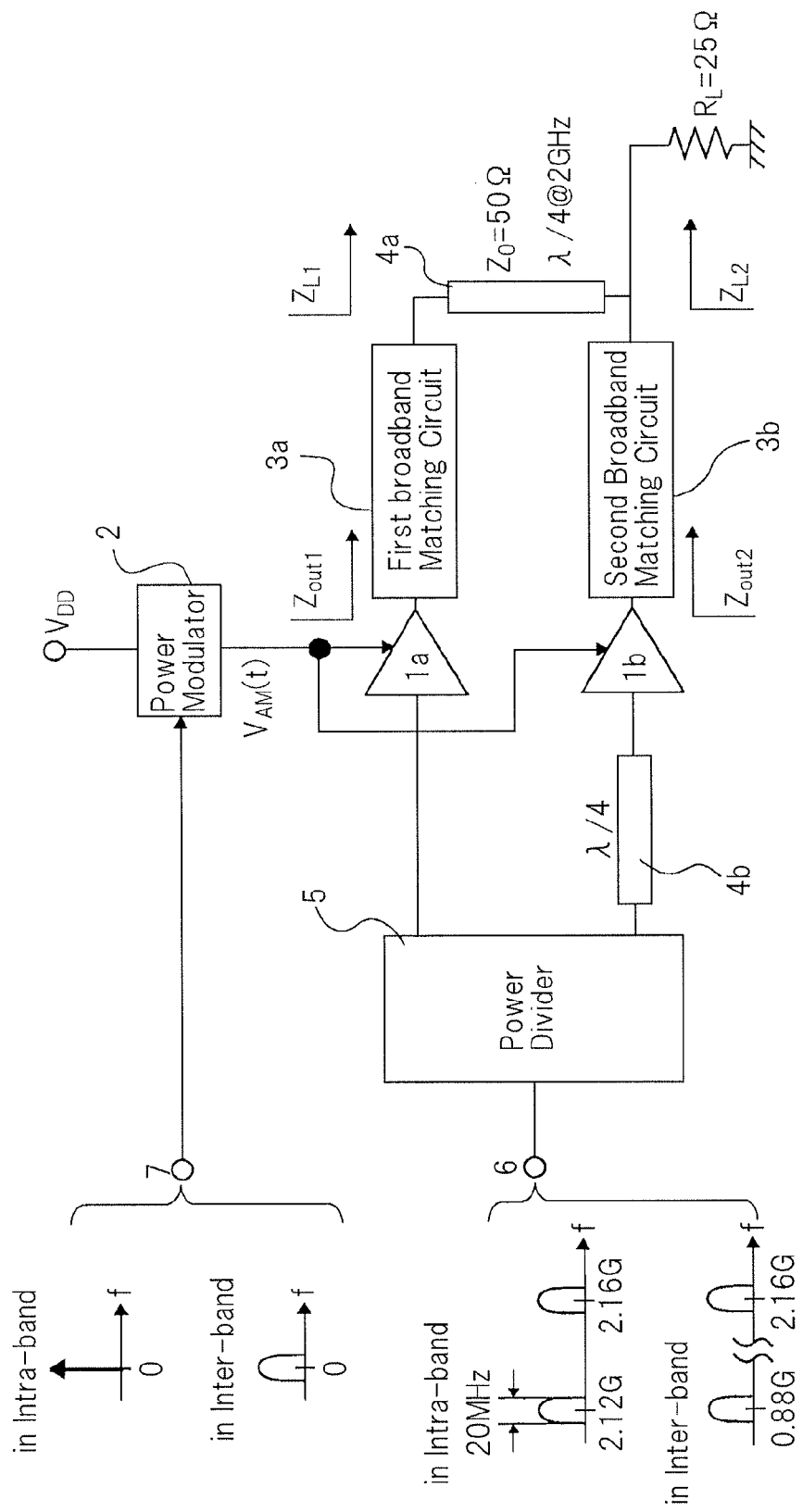
FIG. 5 is a block diagram illustrating the operation example of the power amplifier illustrated in FIG. 4.

FIG. 5 is a block diagram illustrating the operation example of the power amplifier illustrated in FIG. 4. FIG. 5 illustrates operation statuses in the intra-band CA in which frequency allocation is $f_1$=2.12 GHz, $f_2$=2.16 GHz, and $f_{BB}$=20 MHz and in the inter-band CA in which frequency allocation is $f_1$=0.88 GHz, $f_2$=2.16 GHz, and fBB=20 MHz.

Figure 6:
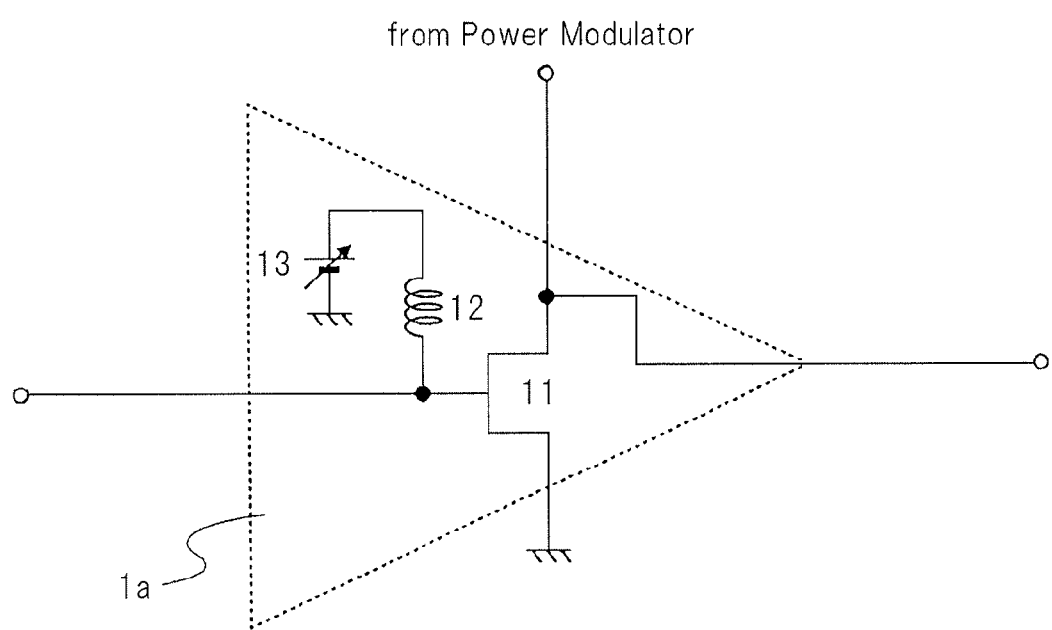
FIG. 6 is a circuit diagram illustrating the configuration example of a first amplifier illustrated in FIG. 4.
Figure 7:
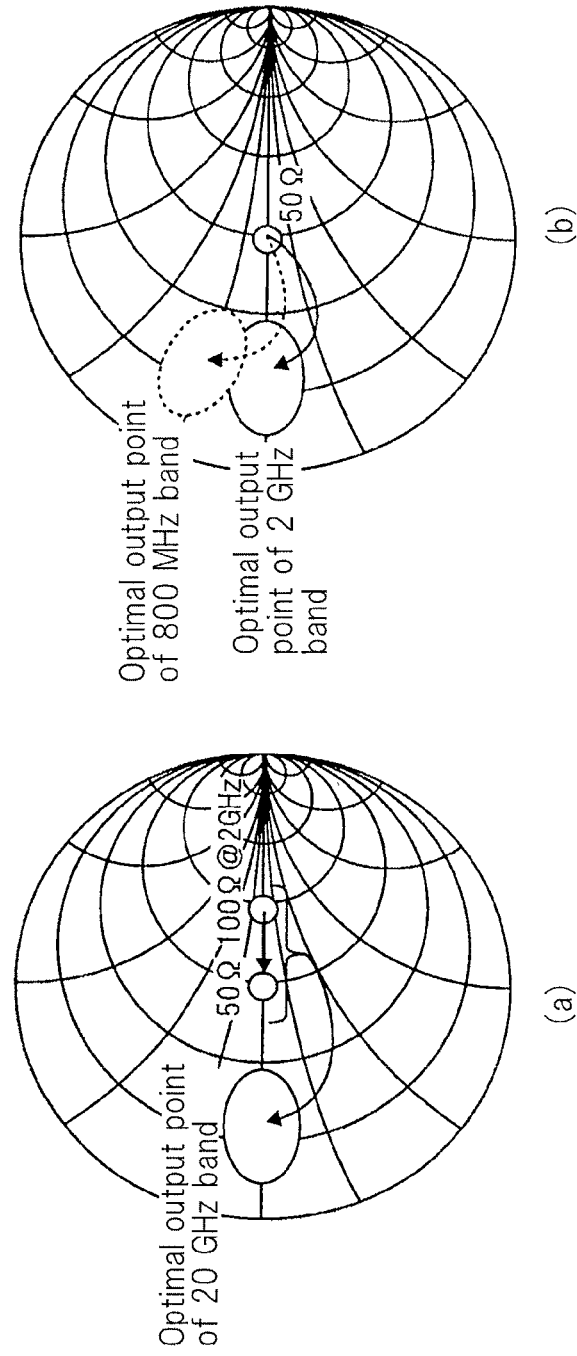
FIG. 7 is Smith charts illustrating the operations of first and second broadband matching circuits illustrated in FIG. 4.

FIG. 6 is a circuit diagram illustrating the configuration example of the first amplifier illustrated in FIG. 4.

As illustrated in FIG. 6, first amplifier 1a can be realized by, for example, source-grounded field-effect transistor 11. The operation point of field-effect transistor 11 can be set by changing a DC voltage (gate voltage) supplied from variable gate power source 13 via choke inductor 12. Second amplifier 1b illustrated in FIG. 4 and third amplifier 1c described below can be realized by a configuration similar to that of first amplifier 1a illustrated in FIG. 6.

FIGS. 7A and 7B are Smith charts illustrating the operations of the first and second broadband matching circuits illustrated in FIG. 4.

Figure 8:
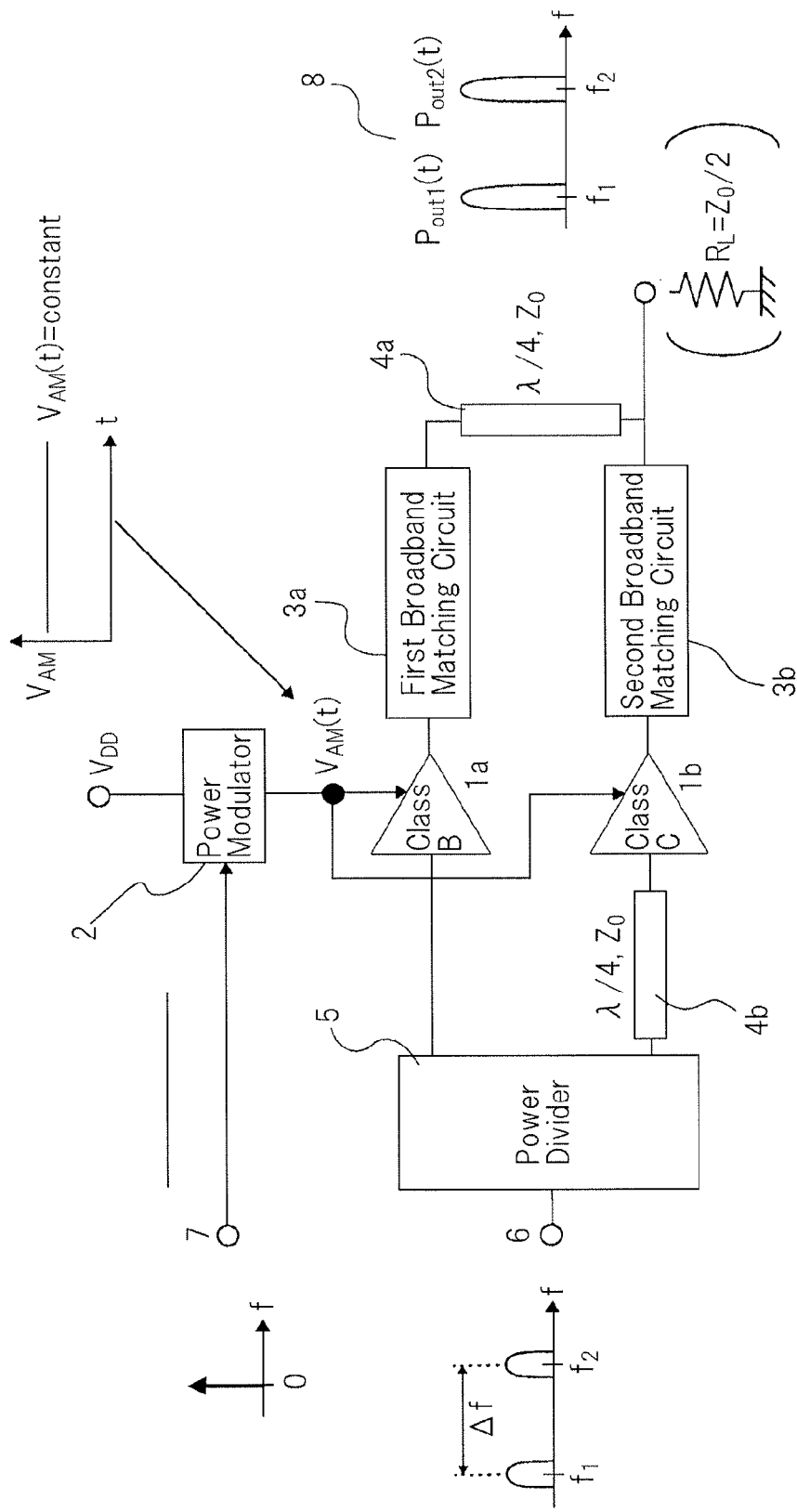
FIG. 8 is a block diagram more specifically illustrating the operation example of the power amplifier illustrated in FIG. 5.
Figure 9:
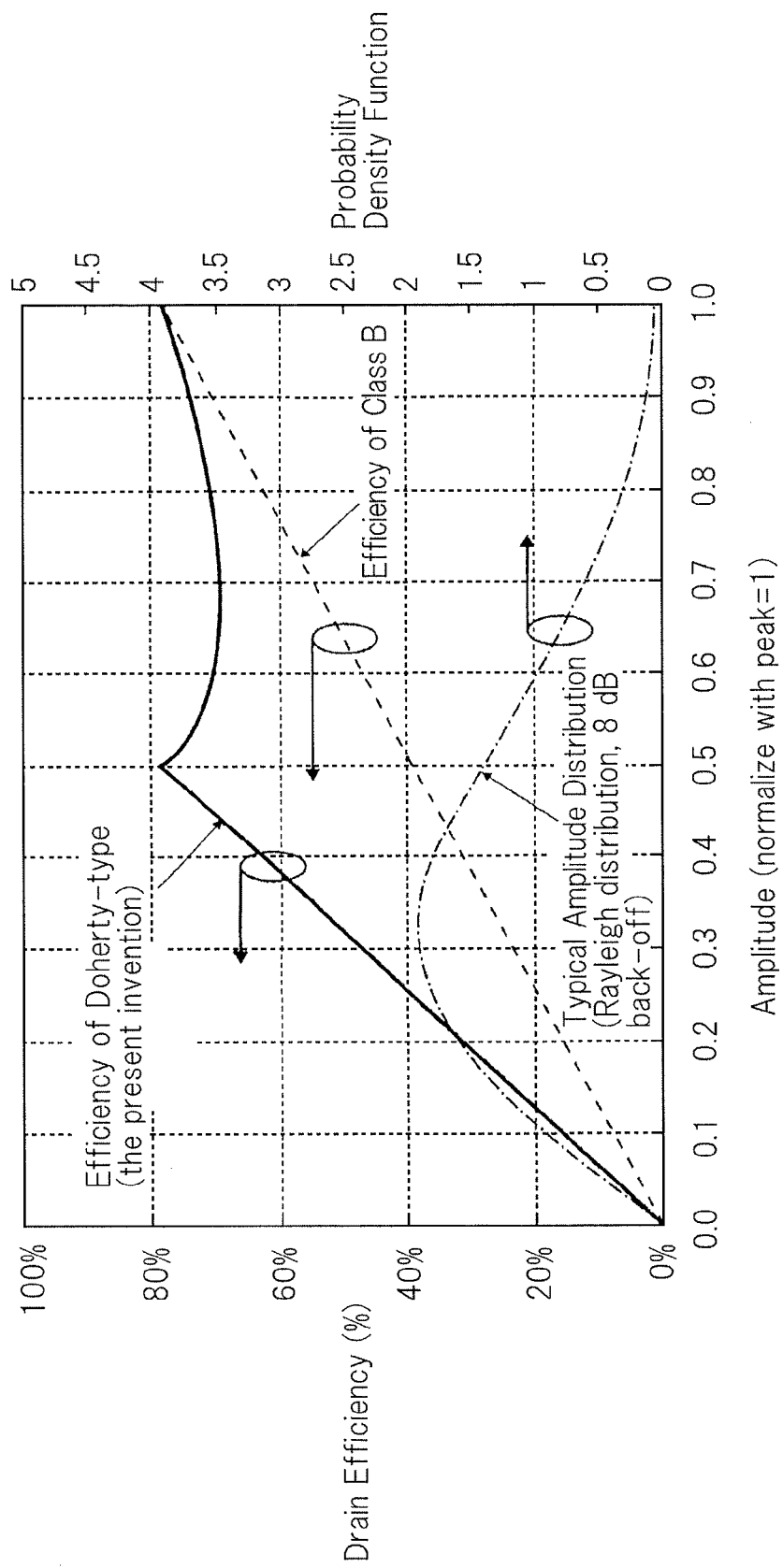
FIG. 9 is a block diagram more specifically illustrating the operation example of the power amplifier illustrated in FIG. 5.
Figure 10:
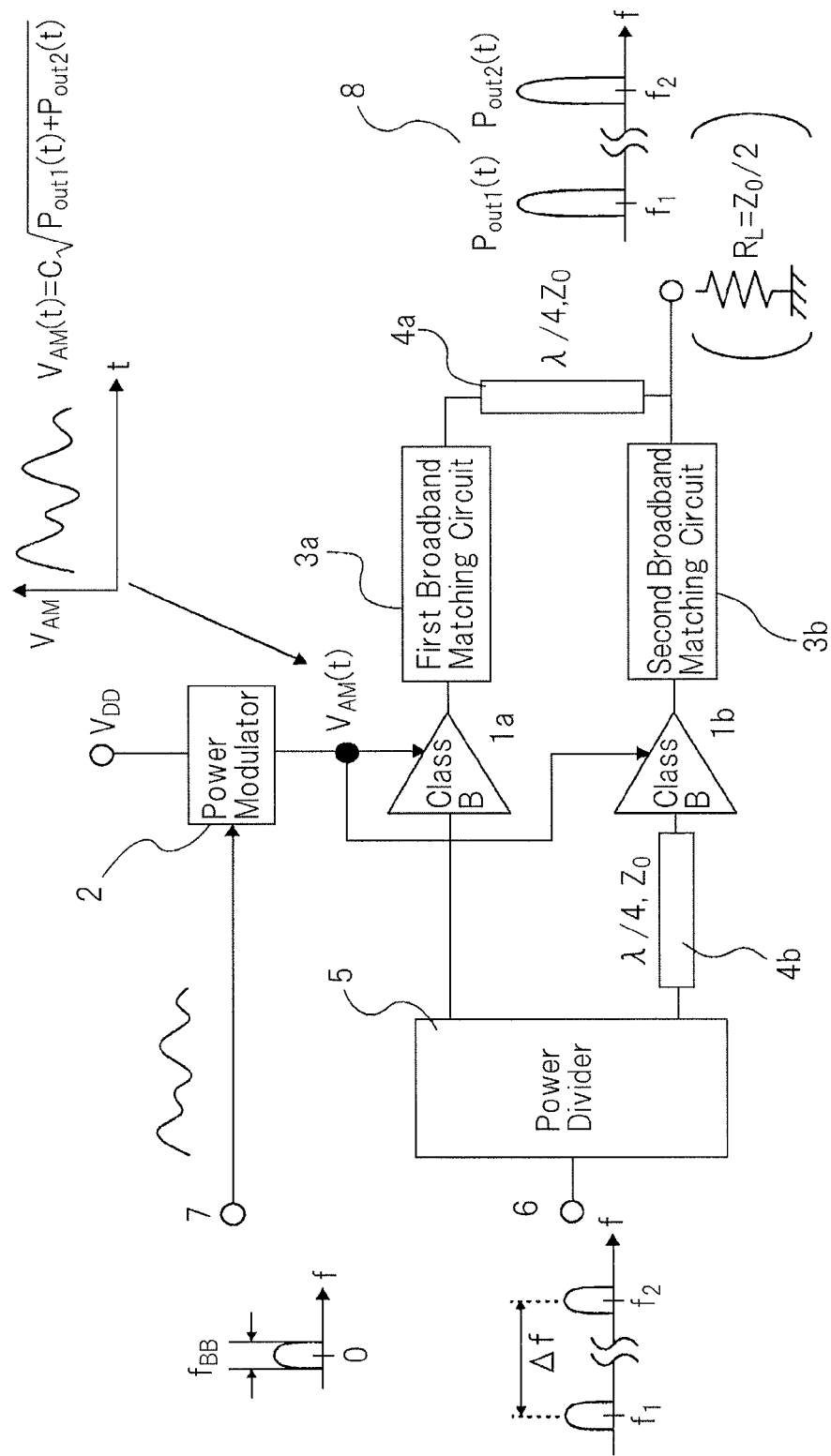
FIG. 10 is a block diagram more specifically illustrating the operation example of the power amplifier illustrated in FIG. 5.
Figure 11:
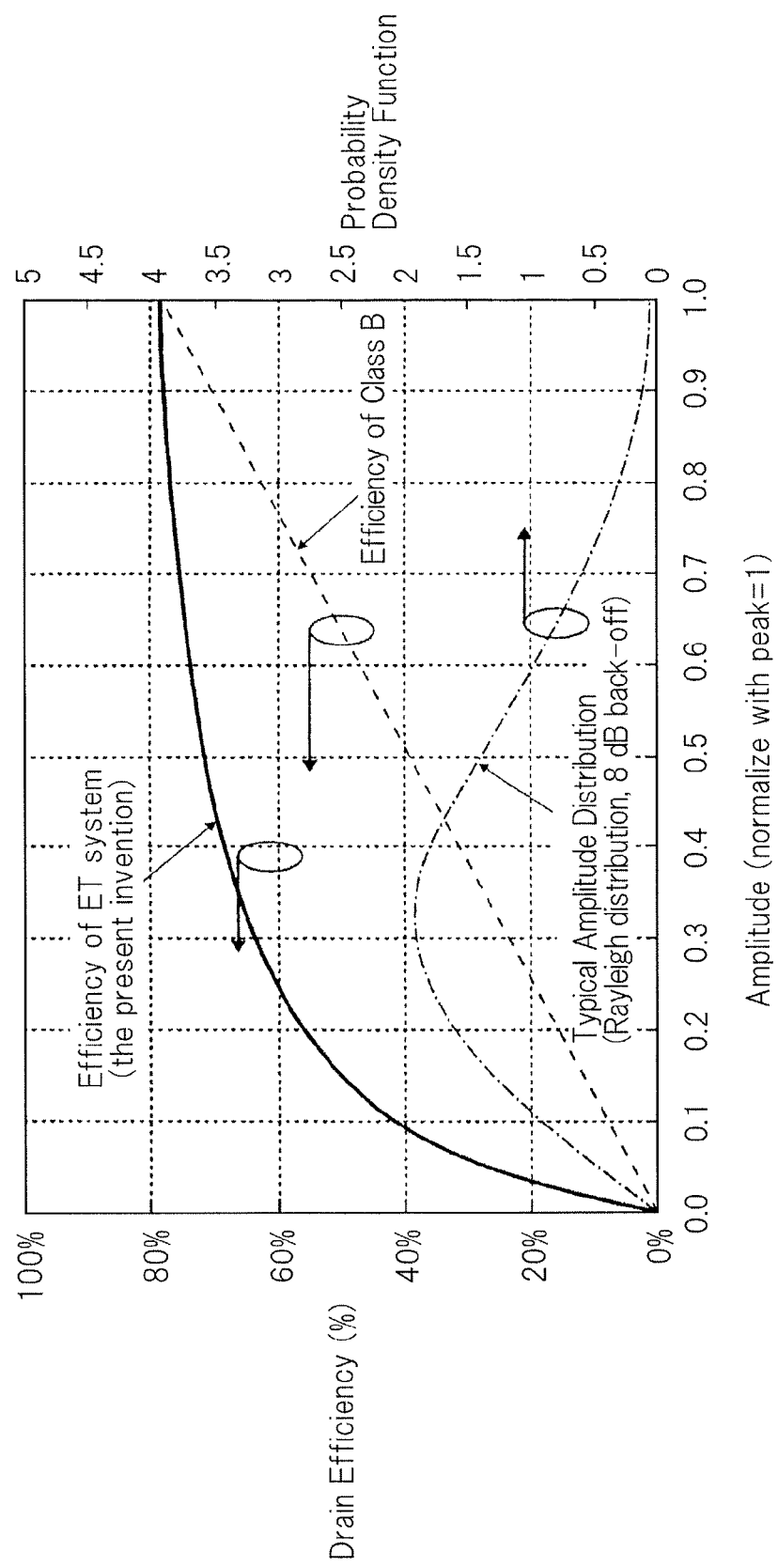
FIG. 11 is a block diagram more specifically illustrating the operation example of the power amplifier illustrated in FIG. 5.

FIGS. 8 to 11 are block diagrams each more specifically illustrating the operation example of the power amplifier illustrated in FIG. 5. FIG. 8 illustrates an operation in the intra-band CA in which frequency allocation is $f_1$=2.12 GHz, $f_2$=2.16 GHz, and $f_{BB}$=20 MHz. FIG. 9 illustrates an operation in the intra-band CA in which frequency allocation is $f_1$=2.12 GHz, $f_2$=2.16 GHz, and $f_{BB}$=20 MHz. FIG. 10 illustrates an operation in the inter-band CA in which frequency allocation is $f_1$=0.88 GHz, $f_2$=2.16 GHz, and $f_{BB}$=20 MHz. FIG. 11 illustrates an operation in the inter-band CA in which frequency allocation is $f_1$=0.88 GHz, $f_2$=2.16 GHz, and $f_{BB}$=20 MHz.

As illustrated in FIG. 5, it is assumed that the power amplifier according to the exemplary embodiment is designed so as to achieve, for example, impedance $R_L$ of the load=25Ω, characteristic impedance $Z_0$ of transmission line 4a=50Ω, and λ/4 (λ: wavelength) lengths of transmission lines 4a and 4b with respect a 2 GHz band.

First, the operation of the power amplifier according to the exemplary embodiment in the intra-band CA in which the frequency allocation is $f_1$=2.12 GHz, $f_2$=2.16 GHz, and the baseband bandwidth $f_{BB}$=20 MHz will be described.

In this case, Δf=2.16 GHz-2.12 GHz=40 MHz is set, and the interval Δf (f2−f1) between the two carrier frequencies is approximately equal to the baseband bandwidth $f_{BB}$=20 MHz.

Accordingly, the instantaneous power of the signal synthesizing (mixing) the two modulation signals is, as indicated by the formula (2), affected by the phase interference term of the two carrier frequencies to increase the baseband bandwidth to approximately 40 MHz that is double the modulation bandwidth of each carrier frequency.

In this case, in the power amplifier according to the exemplary embodiment, as illustrated in FIG. 8, respective operation points are set so that first amplifier 1a can operate in class B (or AB) while second amplifier 1b can operate in class C.

For example, as illustrated in FIG. 6, first and second amplifiers 1a and 1b can be realized by source-grounded field-effect transistor 11, and operated in class B or C by changing the DC voltage output from variable gate power source 13. The output voltage of variable gate power source 13 is set by control unit 6 according to, for example, the relationship of $f_1$, $f_2$, and $f_{BB}$. When $f_1$, $f_2$, and $f_{BB}$ are known in advance, the regulator or the like of the transmission device may input an instruction to control unit 6 from the outside, thereby setting the output voltage of variable gate power source 13. Control unit 6 can be realized by, for example, an information processing device (computer) or an information processing IC (Integrated Circuit) including a CPU (Central Processing Unit), a memory, a D/A (Digital-Analog) converter, and an A/D (Analog-Digital) converter and the like.

Power modulator 2 converts, according to input constant control signal 7, the power supply voltage $V_{DD}$ into a constant voltage ($V_{AM}(t)$=constant) optimal to first and second amplifiers 1a and 1b to output the voltage. In this case, power modulator 2 operates as a DC-DC converter. Control signal 7 is generated by control unit 6 to be supplied to power modulator 2.

By operating first and second amplifiers 1a and 1b and power modulator 2 in the aforementioned manner, the power amplifier illustrated in FIG. 4 is operated as a Doherty-type power amplifier in the intra-band CA.

In the intra-band CA, when the amplitude of RF modulation signal 8 output from the power amplifier is smaller than ½ of maximum amplitude, only first amplifier 1a operates. At this time, the impedance $Z_{L1}$ of the load seen from first broadband matching circuit 3a illustrated in FIG. 5 is converted to 100Ω by operating transmission line 4a as an impedance transformer.

When the amplitude of RF modulation signal 8 is larger than ½ of the maximum amplitude, both first and second amplifiers 1a and 1b operate. At this time, due to the load modulation principle of second amplifier 1b, the impedance $Z_{L1}$ of the load seen from first broadband matching circuit 3a at the maximum amplitude of RF modulation signal 8 is 50Ω.

As illustrated in FIG. 7(a), first broadband matching circuit 3a is designed so as to match the output impedance $Z_{out1}$ of first amplifier 1a with the impedance $Z_{L1}$ of the load=50 to 100Ω at the 2 GHz band. On the other hand, second broadband matching circuit 3b is designed so as to match the output impedance $Z_{out2}$ of second amplifier 1b with the impedance $Z_{L2}$ of the load=50Ω.

FIG. 9 illustrates the power (drain) efficiency of the power amplifier according to the exemplary embodiment in the intra-band CA in which the frequency allocation is $f_1$=2.12 GHz, $f_2$=2.16 GHz, and $f_{BB}$=20 MHz, and the power efficiency of the B-class amplifier according to Comparative Example. The power efficiency is represented as the amplitude function of the modulation signal. FIG. 9 illustrates, as a typical example of the amplitude distribution of the modulation signal, a Rayleigh distribution during 8 dB back-off.

As described above, the power amplifier according to the embodiment operates as the Doherty-type power amplifier in the intra-band CA, and thus at the amplitude ½ (equivalent to 6 dB back-off in the case of power), the power efficiency is maximum, namely, 78.5%. In other words, as indicated by the Rayleigh distribution, since the high power efficiency is provided in the low output (back-off) region in which the appearance frequency of amplitude is high, high average power efficiency can be achieved during the amplification of the modulation signal.

Generally, in the Doherty-type power amplifier, since a transmission line that has a length equivalent to the ¼ wavelength of the RF modulation signal to be amplified is used, the characteristics of the amplifier exhibits strong frequency dependence. However, it is empirically known that the amplifier operates with high power efficiency when the ratio (specific band) of the baseband bandwidth to the carrier frequency is approximately 10% or lower.

In the aforementioned example of the intra-band CA, the baseband bandwidth of synthesized RF modulation signal 8 is approximately 40 MHz, and a specific band with respect to the carrier frequency of 2 GHz band is approximately 2%. Accordingly, the power amplifier according to the exemplary embodiment can be regarded as a Doherty-type power amplifier in the intra-band CA.

On the other hand, in the ET system, when the baseband bandwidth is large as described above, it is difficult to achieve power amplifier 2 that will operate at high power efficiency and that is configured to respond at a high speed. Thus, the ET system is not suited to the intra-band CA.

Next, the operation of the power amplifier according to the exemplary embodiment illustrated in FIG. 5 in the inter-band CA in which the frequency allocation is $f_1$=0.88 GHz, $f_2$=2.16 GHz, and the baseband bandwidth $f_{BB}$=20 MHz will be described.

In this case, the interval between the carrier frequencies is Δf=2.16 GHz-0.88 GHz=1.28 GHz, sufficiently larger than the baseband bandwidth $f_{BB}$=20 MHz. Accordingly, the instantaneous power of the signal combining the modulation signal of the two carrier frequencies is, as indicated by the formula (3), nondependent on the interval Δf between the two carrier frequencies, and the baseband bandwidth is approximately equal to the baseband bandwidth $f_{BB}$ of the modulation signal superimposed on each carrier frequency, namely, 20 MHz.

In the power amplifier according to the exemplary embodiment, in the inter-band CA, as illustrated in FIG. 10, respective operation points are set so that first and second amplifiers 1a and 1b can operate in class B (or AB). For example, as illustrated in FIG. 6, first and second amplifiers 1a and 1b can be realized by source-grounded field-effect transistor 11, and operated in class B or AB by changing the DC voltage output from variable gate power source 13. The output voltage of variable gate power source 13 is set by control unit 6 according to, for example, the relationship of $f_1$, $f_2$, and $f_{BB}$.

Control signal 7 proportional to the square root of the sum of the output power $P_{out1}(t)$ of $f_1$=0.88 GHz and the output power $P_{out2}(t)$ of $f_2$=2.16 GHz indicated by the formula (4) is input to power modulator 2. Power modulator 2 supplies, according to control signal 7, a voltage $V_{AM}$=C($P_{out1}(t)$+$P_{out2}(t)$)$^{0.5}$ (C is constant) acquired by modulating the power supply voltage $V_{DD}$ to first and second amplifiers 1a and 1b. Similarly, in this case, control signal 7 is generated by control unit 6 to be supplied to power modulator 2.

By operating first and second amplifiers 1a and 1b and power modulator 2 in the aforementioned manner, the power amplifier illustrated in FIG. 4 is operated as a power amplifier based on the ET system in the inter-band CA. Note that, in the power amplifier according to the exemplary embodiment, first and second amplifiers 1a and 1b constitute a balance-type amplifier. At this time, the impedance $Z_{L1}$ of the load seen from first broadband matching circuit 3a illustrated in FIG. 5 is set to 50Ω by the balance operation of first and second amplifiers 1a and 1b.

As illustrated in FIG. 7(b), first broadband matching circuit 3a is designed so as to achieve, in both $f_1$=0.88 GHz and $f_2$=2.16 GHz, matching with the output impedance $Z_{out1}$ of first amplifier 1a. Similarly, second broadband matching circuit 3b is designed so as to achieve, in both $f_1$=0.88 GHz and $f_2$=2.16 GHz, matching with the output impedance $Z_{out2}$ of second amplifier 1b. By including first and second broadband matching circuit 3a and 3b, first and second amplifiers 1a and 1b constitute a broadband B-class balance-type amplifier capable of amplifying the signals of the frequency bands of both $f_1$=0.88 GHz and $f_2$=2.16 GHz.

Figure 1:
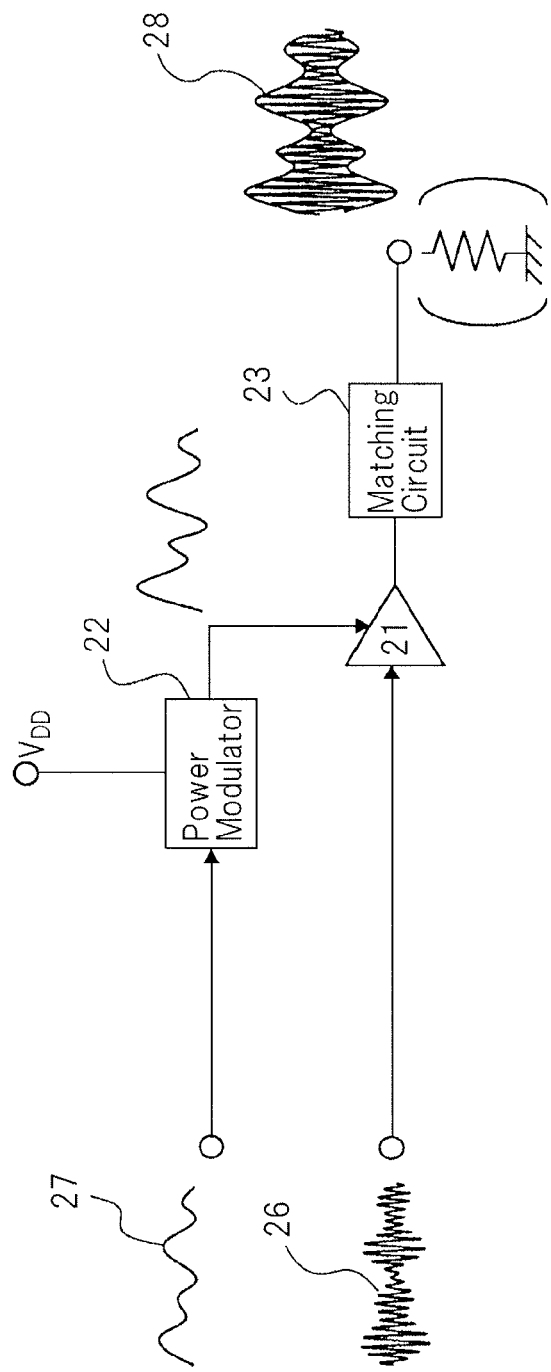
FIG. 1 is a block diagram illustrating the configuration example of a power amplifier based on an ET system.

FIG. 11 illustrates the power (drain) efficiency of the power amplifier according to the exemplary embodiment in the inter-band CA in which the frequency allocation is $f_1$=0.88 GHz, $f_2$=2.16 GHz, and $f_{BB}$=20 MHz, and the power efficiency of the B-class amplifier according to the Comparative Example. The power efficiency is represented as the amplitude function of the modulation signal. FIG. 1 illustrates, as a typical example of the amplitude distribution of the modulation signal, Rayleigh distribution during 8 dB back-off.

As described above, the power amplifier according to the exemplary embodiment operates as the power amplifier of the ET system in the inter-band CA and, operates in a small amplitude (large back-off) region, with power efficiency higher than that of the B-class amplifier because only minimum power necessary for the amplifier is supplied. This enables realizing high average power efficiency during amplification of the modulation signal.

In the power amplifier of the ET system, generally, when the baseband bandwidth is large, it is difficult to realize power amplifier 2 that operates at high power efficiency and that is configured to respond at a high speed. However, in the aforementioned example of the inter-band CA, since the baseband bandwidth of the synthesized signal is equal to the baseband bandwidth of each carrier frequency, approximately 20 MHz, power amplifier 2 that operates at high power efficiency can be realized. On the other hand, the Doherty-type power amplifier is not suited to the inter-band CA because it is subject to restrictions of the transmission line set to a length has is equivalent to the ¼ wavelength of the carrier frequency.

Figure 2:
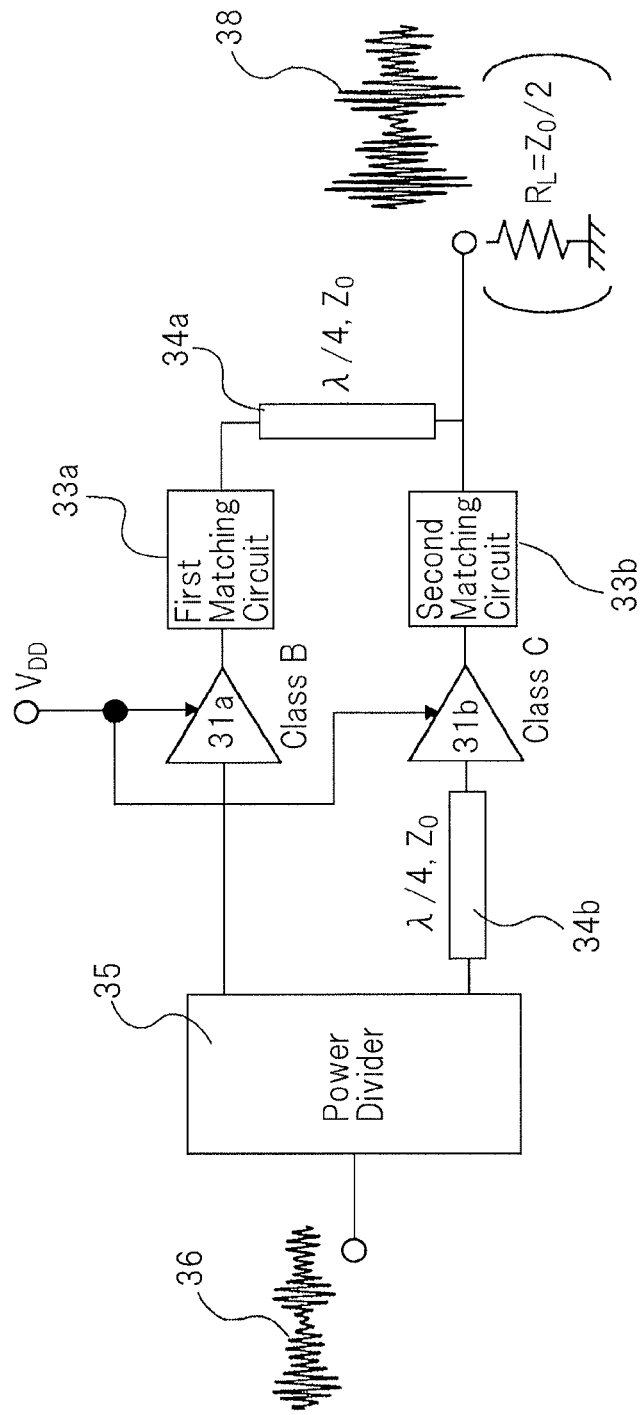
FIG. 2 is a block diagram illustrating the configuration example of a Doherty-type power amplifier.
Figure 3:
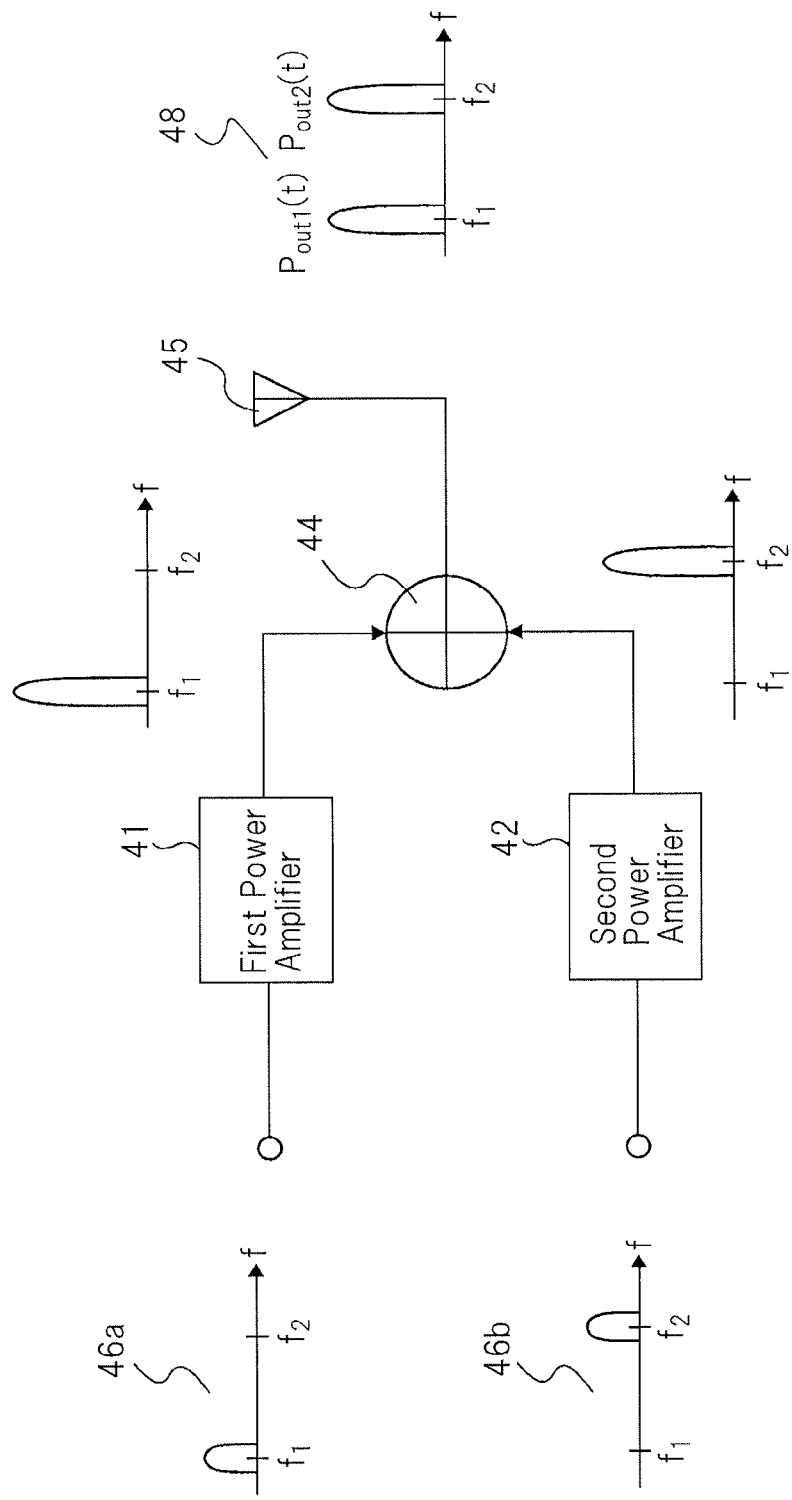
FIG. 3 is a block diagram illustrating the configuration example of a transmission device to which a CA technology is applied according to the background art.

First broadband matching circuit 3a must be designed to satisfy both conditions illustrated in FIGS. 7A and 7B. The matching circuit satisfying the condition illustrated in FIG. 7(a) is also achieved by the Doherty-type power amplifier of the background art (matching circuit 3a and 3b illustrated in FIG. 2) that amplifies the modulation signal of one carrier frequency. Further, through optimal designing executed by using a passive circuit such as a transmission line, a capacity, or an inductor, broadband matching circuit that simultaneously satisfies the condition illustrated in FIG. 7(b) can be realized.

Similarly, second broadband matching circuit 3b must be designed to satisfy the condition illustrated in FIG. 7(b). Such a broadband matching circuit can also be realized through optimal designing executed by using a passive circuit such as a transmission line, a capacity, or an inductor.

As described above, the power amplifier according to the exemplary embodiment is configured to operate as a Doherty-type power amplifier in the intra-band CA and as the power amplifier of the ET system in the inter-band CA. Thus, in any one of the frequency allocations of the intra-band CA and the inter-band CA, the modulation signal including the plurality of carrier frequencies can be amplified with high power efficiency.

The power amplifier according to the exemplary embodiment is configured such that the amplifiers for commonly amplifying the RF signal of the plurality of carrier frequency bands are used, is configured such that an individual power amplifier is not provided for each carrier frequency. Accordingly, the size of the transmission device is substantially equal to that in a configuration where the RF signal of a single carrier frequency is amplified. Therefore, a transmission device that is more compact than that of the background art can be provided.

Further, by changing the operations of first and second amplifiers 1a and 1b according to the frequency allocation (intra-band CA or inter-band CA), the power amplifier can be compatible with both the intra-band CA and the inter-band CA. Thus, the power amplifier can flexibly deal with a change of the carrier frequency.

In the exemplary embodiment, the example of the CA technology using the two carrier frequencies has been described. However, by operating the power amplifier as a Doherty-type power amplifier when the frequency allocation is the intra-band CA and as a power amplifier of the ET system when the frequency allocation is the inter-band CA, the power amplifier according to the exemplary embodiment can be applied to a case where three or more carrier frequencies are used.

The carrier frequency is not limited to the combination of frequencies in the exemplary embodiment. The configuration of the power amplifier according to the exemplary embodiment can be applied to various combinations of frequencies.

When the power amplifier according to the exemplary embodiment is operated based on the ET system, the output voltage $V_{AM}$ of power modulator 2 is not required to strictly satisfy the relationship of $C(P_{out1}(t)) + P_{out2}(t))^{0.5}$ (C is constant). For example, the output voltage of power modulator 2 may include an offset voltage, or a voltage subjected to appropriate processing, such as restriction of a frequency band, may be output from power modulator 2.

Further, when the power amplifier according to the exemplary embodiment is operated based on the ET system, for example, first and second broadband matching circuits 3a and 3b may be designed to realize, only for the two carrier frequencies of $f_1$=0.88 GHz and $f_2$=2.16 GHz, matching with the output impedances $Z_{out1}$ and $Z_{out2}$ of first and second amplifiers 1a and 1b, or may be designed to realize matching with the output impedances $Z_{out1}$ and $Z_{out2}$ of first and second amplifiers 1a and 1b within a frequency range that includes the two carrier frequencies of $f_1$=0.88 GHz and $f_2$=2.16 GHz.

Second Exemplary Embodiment

Figure 12:
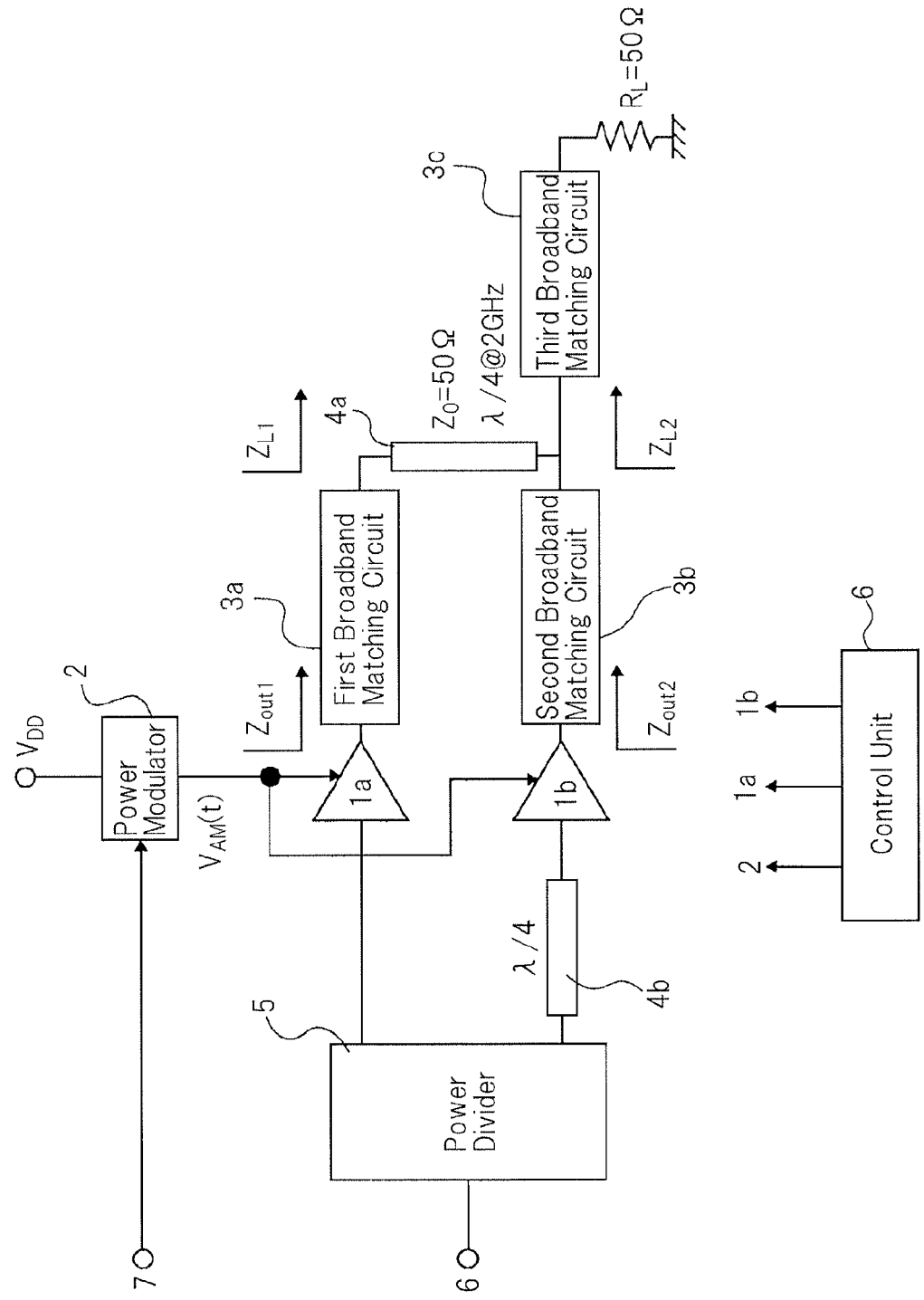
FIG. 12 is a block diagram illustrating the configuration example of a power amplifier according to a second exemplary embodiment.

FIG. 12 is a block diagram illustrating the configuration example of a power amplifier according to a second exemplary embodiment.

As illustrated in FIG. 12, the power amplifier according to the second exemplary embodiment employs a configuration where third broadband matching circuit 3c is added between the output terminal and the load of the power amplifier according to the first exemplary embodiment illustrated in FIG. 4. Other components and operations are similar to those of the first exemplary embodiment, and thus description thereof will be omitted.

Figure 13:
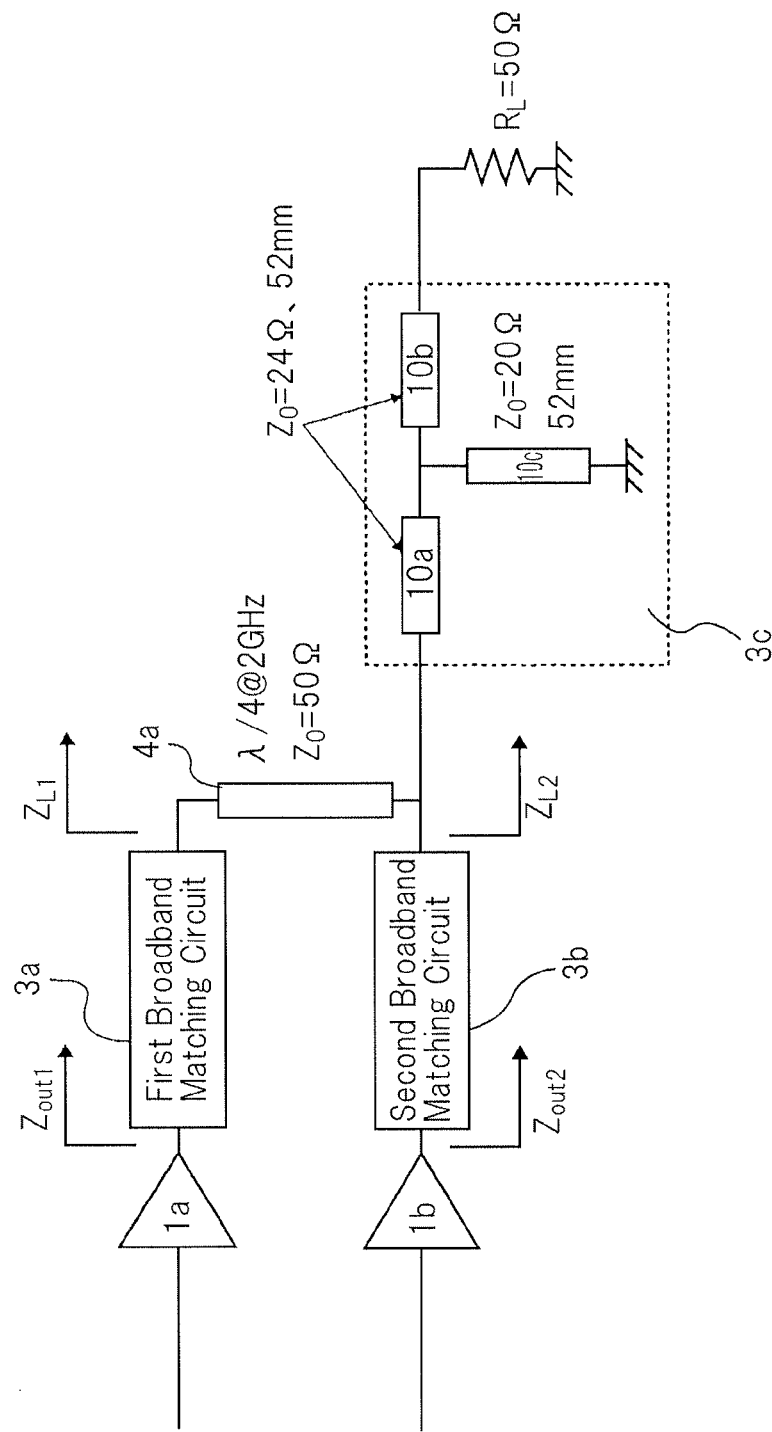
FIG. 13 is a block diagram illustrating the configuration example of a third broadband matching circuit illustrated in FIG. 2.

FIG. 13 is a block diagram illustrating the configuration example of the third broadband matching circuit illustrated in FIG. 12.

As illustrated in FIG. 13, third broadband matching circuit 3c is configured by including two transmission lines 10a and 10b connected in series between the output terminal and the load $R_L$ of second broadband matching circuit 3b and transmission line 10c having one end connected to the connection node of two transmission lines 10a and 10b and the other end grounded.

Transmission lines 10a and 10b are lines each having, for example, characteristic impedance $Z_0$=24Ω and a length 53 mm. Transmission line 10c is a line having, for example, characteristic impedance $Z_0$=20Ω and a length 53 mm.

According to the second exemplary embodiment, due to the inclusion of third broadband matching circuit 3c, for example, for both the modulation signals of a carrier frequency $f_1$ (800 MHz band) and a carrier frequency $f_2$ (2 GHz band), the impedance $R_L$=50Ω seen from second broadband matching circuit 3b is converted to $Z_{L2}$=25Ω.

According to the second exemplary embodiment, due to the inclusion of third broadband matching circuit 3c, since the output impedance of the power amplifier can be converted to a desired value in the signal band of the two carrier frequencies, without changing the load (antenna device or the like), the output impedance of the power amplifier can be converted to a desired value corresponding to the impedance of the load.

FIG. 13 illustrates the example of the load $R_L$ of the impedance 50Ω employed in many transmission devices. However, by optimally designing transmission lines 10a to 10c constituting third broadband matching circuit 3c, the power amplifier can deal with the load of any value.

Third Exemplary Embodiment

Figure 14:
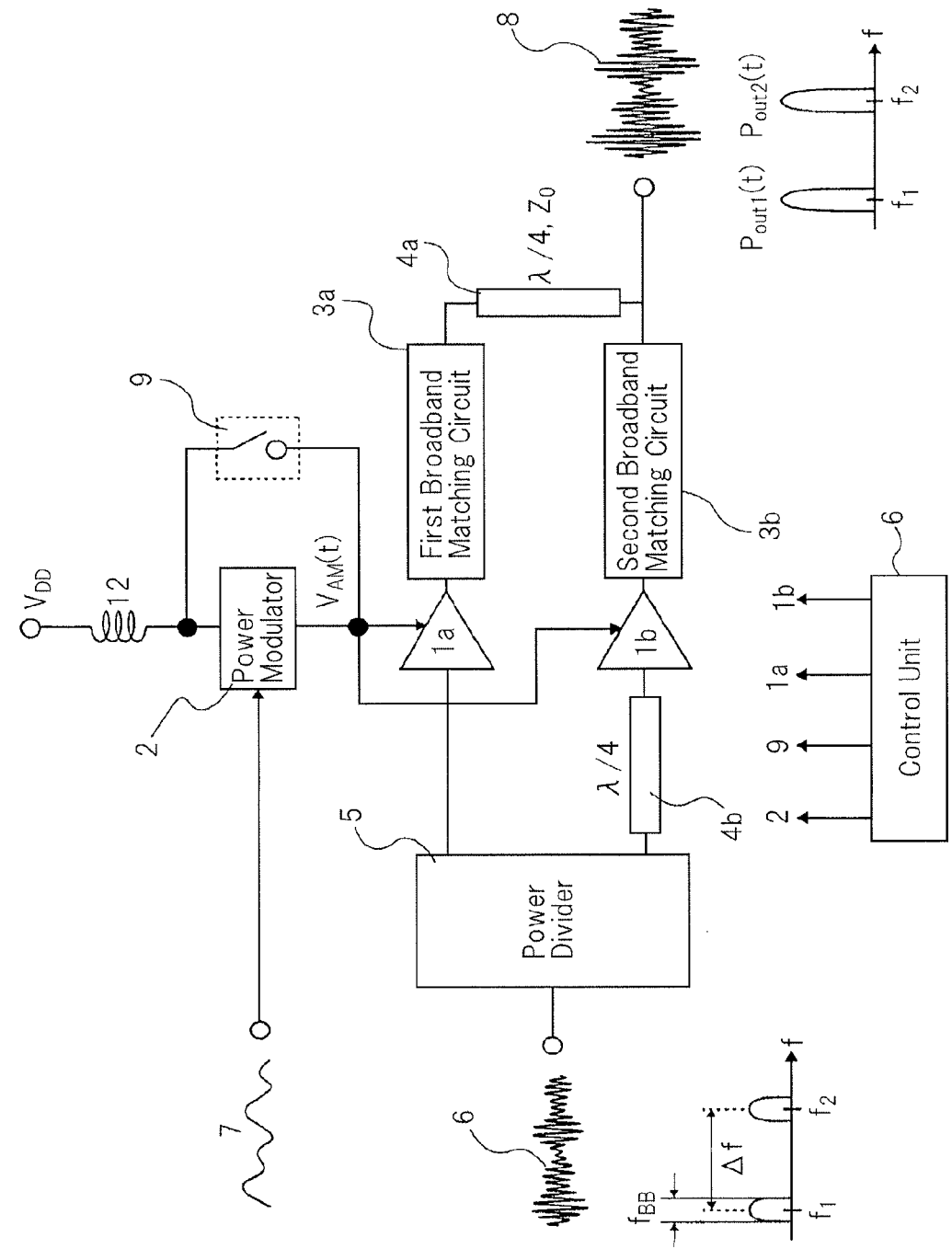
FIG. 14 is a block diagram illustrating the configuration example of a power amplifier according to a third exemplary embodiment.

FIG. 14 is a block diagram illustrating the configuration example of a power amplifier according to a third exemplary embodiment.

As illustrated in FIG. 14, the power amplifier according to the third exemplary embodiment employs a configuration where switch circuit 9 connected in parallel to power modulator 2 is provided between power source $V_{DD}$ and first and second amplifiers 1a and 1b. Other components and operations are similar to those of the first exemplary embodiment, and thus description thereof will be omitted. Switch circuit 9 illustrated in FIG. 14 may be included in the power amplifier according to the second exemplary embodiment.

In the power amplifier according to the exemplary embodiment, in the case of the intra-band CA in which the interval between two carrier frequencies $f_1$ and $f_2$ is approximately similar to a baseband bandwidth, switch circuit 9 is turned ON (short-circuited) to supply a power supply voltage $V_{DD}$ to first amplifier 1a that operates in class B and second amplifier 1b that operates in class C via choke inductor 12. The ON/OFF operation of switch circuit 9 may be controlled by control unit 6 described above in the first exemplary embodiment.

This configuration enables, in the intra-band CA, as in the case of the first exemplary embodiment, the amplifier circuit illustrated in FIG. 14 to operate as a Doherty-type power amplifier by turning switch circuit 9 ON.

In the case of the inter-band CA in which the interval between the two carrier frequencies $f_1$ and $f_2$ is sufficiently larger than the baseband bandwidth, switch circuit 9 is turned OFF (opened) to supply a voltage acquired by modulating power supply voltage $V_{DD}$ by power modulator 2 to first and second amplifiers 1a and 1b.

This configuration enables, in the inter-band CA, as in the case of the first exemplary embodiment, the amplifier circuit illustrated in FIG. 14 to operate as the power amplifier of the ET system by turning switch circuit 9 OFF.

When the power amplifier according to the third exemplary embodiment is operated as a Doherty-type power amplifier, power modulator 2 is not necessary, and thus the operation of power modulator 2 can be stopped. In this case, since there is no further power loss by power modulator 2, the power amplifier can be operated with higher power efficiency.

Further, power modulator 2 does not need to operate as a DC-DC converter. A modulation power source that only corresponds to the ET system may be designed to be exclusively used. Thus, the performance of power modulator 2 can be improved.

Fourth Exemplary Embodiment

Figure 15:
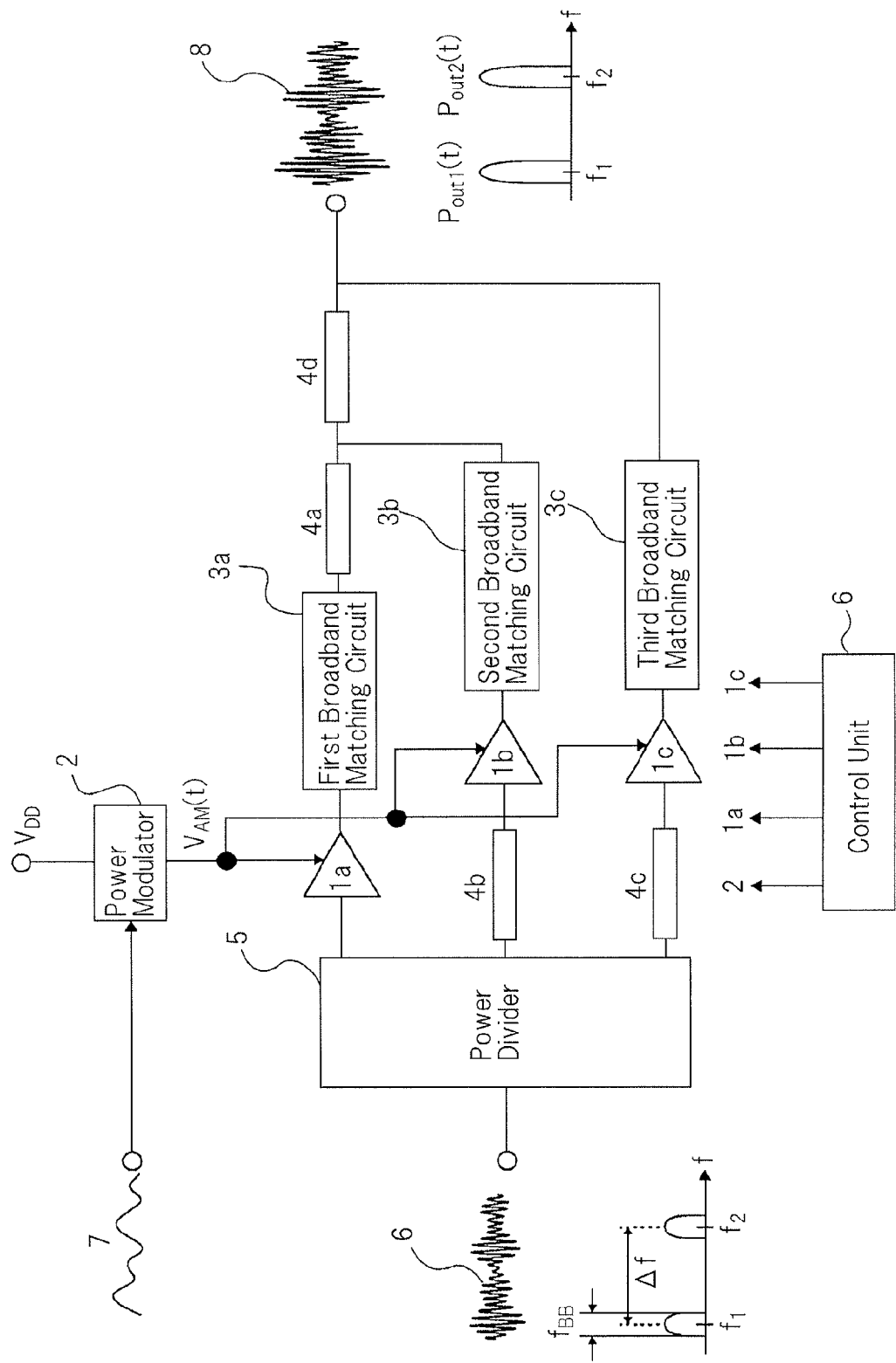
FIG. 15 is a block diagram illustrating the configuration example of a power amplifier according to a fourth exemplary embodiment.

FIG. 15 is a block diagram illustrating the configuration example of a power amplifier according to a fourth exemplary embodiment.

As illustrated in FIG. 15, the power amplifier according to the fourth exemplary embodiment employs a configuration where three amplifiers (first, second and third amplifiers 1a, 1b, and 1c) connected in parallel are provided.

RF modulation signal 6 including the two carrier frequencies $f_1$ and $f_2$ ($f_2 > f_1$, $\Delta f = f_2 - f_1$) is input to the power amplifier illustrated in FIG. 15. Transmission lines 4a and 4b in which the modulation bandwidth (baseband bandwidth) of each carrier frequency is $f_{BB}$ as in the case of the first exemplary embodiment are lines each having a length $\lambda/4$ ($\lambda$ is equivalent to wavelength of carrier frequency) and characteristic impedance $Z_0$.

RF modulation signal 6 is divided to first, second and third amplifiers 1a to 1c by power divider 5. At this time, RF modulation signal 6 is input to second amplifier 1b from power divider 5 via transmission line 4b, and RF modulation signal 6 is input to third amplifier 1c from power divider 5 via transmission line 4c. Transmission line 4c is a line having a length $\lambda/2$ ($\lambda$ is equivalent to wavelength of carrier frequency) and characteristic impedance $2Z_0$.

First broadband matching circuit 3a and transmission lines 4a and 4d are connected in series to the output end of first amplifier 1a, and second broadband matching circuit 3b is connected to the output end of second amplifier 1b. Third broadband matching circuit 3c is connected to the output end of third amplifier 1c. Transmission line 4d is a line having a length $\lambda/4$ ($\lambda$ is equivalent to wavelength of carrier frequency) and characteristic impedance $Z_0$.

Further, the output ends of transmission line 4a and second broadband matching circuit 3b are connected to each other, and the output ends of transmission line 4d and third broadband matching circuit 3c are connected to each other. RF modulation signal 8 combining the output signals of first, second and third amplifiers 1a to 1c is output from the connection node of the output ends of transmission line 4d and third broadband matching circuit 3c.

Power modulator 2 supplies, in the intra-band CA, a predetermined constant voltage to the power terminals of first, second and third amplifiers 1a to 1c. Power modulator 2 modulates, in the inter-band CA, a power supply voltage $V_{DD}$, by using control signal 7 as the amplitude component of RF modulation signal 6, and supplies the modulated voltage to the power terminals of first, second and third amplifiers 1a to 1c.

In the power amplifier according to the exemplary embodiment, in the case of the intra-band CA in which the interval between two carrier frequencies $f_1$ and $f_2$ is approximately similar to a baseband bandwidth, first amplifier 1a is operated in class B while second and third amplifiers 1b and 1c are operated in class C. A constant voltage is supplied from power modulator 2 to first, second and third amplifiers 1a to 1c.

By operating first, second and third amplifiers 1a to 1c and power modulator 2 in the aforementioned manner, the power amplifier illustrated in FIG. 15 is operated as a Doherty-type power amplifier (3Way Doherty type) as in the case of the first exemplary embodiment.

On the other hand, in the case of the inter-band CA in which the interval between the two carrier frequencies $f_1$ and $f_2$ is sufficiently larger than the baseband bandwidth, first, second and third amplifiers 1b to 1c are operated in class B. Control signal 7 proportional to the square root of the sum of the output power $P_{out1}(t)$ of $f_1=0.88$ GHz and the output power $P_{out2}(t)$ of $f_2=2.16$ GHz indicated by the formula (4) is input to power modulator 2. Power modulator 2 supplies, according to control signal 7, a voltage $V_{AM}$ acquired by modulating the power supply voltage $V_{DD}$ to first, second and third amplifiers 1b to 1c.

By operating first, second and third amplifiers 1b to 1c and power modulator 2 in the aforementioned manner, as in the case of the first exemplary embodiment, the power amplifier illustrated in FIG. 15 is operated as a power amplifier based on the ET system.

The operation classes of first, second and third amplifiers 1b to 1c may be set by control unit 6 as in the case of the first exemplary embodiment, and control signal 7 supplied to power modulator 2 may be generated by control unit 6 as in the case of the first exemplary embodiment.

The power amplifier according to the exemplary embodiment can provide the same effects as those of the power amplifier according to the first exemplary embodiment. Note that the power amplifier according to the fourth exemplary embodiment may include third broadband matching circuit 3 of the second exemplary embodiment and switch circuit 9 of the third exemplary embodiment.

When the power amplifier according to the fourth exemplary embodiment is operated as a 3 Way Doherty type, the output power of first, second and third amplifiers 1b to 1c may be set to, for example, the relationship of first amplifier 1a: second amplifier 1b: third amplifier 1c=1:3:4. In this case, power efficiency is maximum not only when the amplitude r of the output signal is ½ (6 dB in the case of power) of maximum amplitude $V_{max}$ but also when the amplitude r of the output signal is ¼ (12 dB in the case of power) of the maximum amplitude $V_{max}$. Thus, when the modulation signal of large PAR is amplified, higher average power efficiency can be achieved.

The ratio of the output power among first, second and third amplifiers 1b to 1c is not limited to the relationship of 1:3:4, but may be appropriately changed according to the use of the power amplifier according to the fourth exemplary embodiment.

The exemplary embodiments of the present invention have been described. However, the present invention is not limited to the exemplary embodiments. Various changes understandable to those skilled in the art can be made of the configuration and the specifics of the present invention within the scope of the invention.

This application claims priority from Japanese Patent Application No. 2012-240005 filed on Oct. 31, 2012, which is hereby incorporated by reference herein in its entirety.

The invention claimed is:
1. A power amplifier comprising:
a power divider for distributing an input signal including a plurality of carrier frequencies to two amplifiers;
a first amplifier for amplifying and outputting one of the signals divided by the power divider;
a first transmission line having a length equivalent to a ¼ wavelength of the carrier frequency included in the input signal;
a second amplifier for receiving the other signal divided by the power divider via the first transmission line and amplifying and outputting the other signal;
a power modulator for supplying a power supply voltage to the first and second amplifiers;
a first matching circuit connected to an output end of the first amplifier and configured to match output impedance of the first amplifier with impedance of a load;
a second matching circuit connected to an output end of the second amplifier and configured to match output impedance of the second amplifier with the impedance of the load;
a second transmission line having a length equivalent to a ¼ wavelength of the carrier frequency, one end connected to an output end of the first matching circuit, and the other end connected to an output end of the second matching circuit, and configured to supply a synthesized signal of output signals of the first and second amplifiers to the load from the other end;
a control unit configured to set operation classes of the first and second amplifiers and supply a control signal for controlling the power supply voltage supplied to the first and second amplifiers to the power modulator; and
when frequency allocation of the plurality of carrier frequencies is in an intra-band carrier aggregation relationship,
the first amplifier is operated in class B while the second amplifier is operated in class C, and
a predetermined constant voltage is supplied as the power supply voltage from the power modulator to the first and second amplifiers; and
when the frequency allocation of the plurality of carrier frequencies is in an inter-band non-contiguous carrier aggregation relationship,
the first and second amplifiers are operated in class B, and
a voltage proportional to an amplitude component of the input signal is supplied as the power supply voltage from the power modulator to the first and second amplifiers.

2. A power amplifier comprising:
a power divider for distributing an input signal including a plurality of carrier frequencies to two amplifiers;
a first amplifier for amplifying and outputting one of the signals divided by the power divider;
a first transmission line having a length equivalent to a ¼ wavelength of the carrier frequency included in the input signal;
a second amplifier for receiving the other signal divided by the power divider via the first transmission line and amplifying and outputting the other signal;
a power modulator for supplying a power supply voltage to the first and second amplifiers;
a first matching circuit connected to an output end of the first amplifier and configured to match output impedance of the first amplifier with impedance of a load;
a second matching circuit connected to an output end of the second amplifier and configured to match output impedance of the second amplifier with the impedance of the load;
a second transmission line having a length equivalent to a ¼ wavelength of the carrier frequency, one end connected to an output end of the first matching circuit, and the other end connected to an output end of the second matching circuit, and configured to supply a synthesized signal of output signals of the first and second amplifiers to the load from the other end;
a control unit configured to set operation classes of the first and second amplifiers and supply a control signal for controlling the power supply voltage supplied to the first and second amplifiers to the power modulator; and
when frequency allocation of the plurality of carrier frequencies is in an intra-band carrier aggregation relationship,
the first amplifier is operated in class B while the second amplifier is operated in class C, and
a predetermined constant voltage is supplied as the power supply voltage from the power modulator to the first and second amplifiers; and
when the frequency allocation of the plurality of carrier frequencies is in an inter-band non-contiguous carrier aggregation relationship,
the first and second amplifiers are operated in class B, and
a voltage proportional to a square root of an output power sum of the first and second amplifiers is supplied as the power supply voltage from the power modulator to the first and second amplifiers.

3. A power amplifier comprising:
a power divider for distributing an input signal including a plurality of carrier frequencies to three amplifiers;
a first amplifier for amplifying and outputting a first signal divided by the power divider;
a first transmission line having a length equivalent to a ¼ wavelength of the carrier frequency included in the input signal;
a second transmission line having a length equivalent to a ½ wavelength of the carrier frequency included in the input signal;
a second amplifier for receiving a second signal divided by the power divider via the first transmission line and amplifying and outputting the second signal;
a third amplifier for receiving a third signal divided by the power divider via the second transmission line and amplifying and outputting the third signal;
a power modulator for supplying a power supply voltage to the first, second and third amplifiers;
a first matching circuit connected to an output end of the first amplifier and configured to match output impedance of the first amplifier with impedance of a load;
a second matching circuit connected to an output end of the second amplifier and configured to match output impedance of the second amplifier with the impedance of the load;
a third matching circuit connected to an output end of the third amplifier and configured to match output impedance of the third amplifier with the impedance of the load;
a third transmission line having one end connected to an output end of the first matching circuit, and the other end connected to an output end of the second matching circuit;
a fourth transmission line having a length equivalent to a ¼ wavelength of the carrier frequency, one end connected to the output end of the second matching circuit, and the other end connected to an output end of the third matching circuit, and configured to supply a synthesized signal of output signals of the first, second and third amplifiers to the load from the other end;
a control unit configured to set operation classes of the first, second and third amplifiers and supply a control signal for controlling the power supply voltage supplied to the first, second and third amplifiers to the power modulator; and
when frequency allocation of the plurality of carrier frequencies is in an intra-band carrier aggregation relationship,
the first amplifier is operated in class B while the second and third amplifiers are operated in class C, and
a predetermined constant voltage is supplied as the power supply voltage from the power modulator to the first, second, and third amplifiers; and
when the frequency allocation of the plurality of carrier frequencies is in an inter-band non-contiguous carrier aggregation relationship,
the first, second, and third amplifiers are operated in class B, and
a voltage proportional to an amplitude component of the input signal is supplied as the power supply voltage from the power modulator to the first, second, and third amplifiers.

4. A power amplifier comprising:
a power divider for distributing an input signal including a plurality of carrier frequencies to three amplifiers;
a first amplifier for amplifying and outputting a first signal divided by the power divider;
a first transmission line having a length equivalent to a ¼ wavelength of the carrier frequency included in the input signal;
a second transmission line having a length equivalent to a ½ wavelength of the carrier frequency included in the input signal;
a second amplifier for receiving a second signal divided by the power divider via the first transmission line and amplifying and outputting the second signal;
a third amplifier for receiving a third signal divided by the power divider via the second transmission line and amplifying and outputting the third signal;
a power modulator for supplying a power supply voltage to the first, second and third amplifiers;
a first matching circuit connected to an output end of the first amplifier and configured to match output impedance of the first amplifier with impedance of a load;
a second matching circuit connected to an output end of the second amplifier and configured to match output impedance of the second amplifier with the impedance of the load;
a third matching circuit connected to an output end of the third amplifier and configured to match output impedance of the third amplifier with the impedance of the load;
a third transmission line having one end connected to an output end of the first matching circuit, and the other end connected to an output end of the second matching circuit;
a fourth transmission line having a length equivalent to a ¼ wavelength of the carrier frequency, one end connected to the output end of the second matching circuit, and the other end connected to an output end of the third matching circuit, and configured to supply a synthesized signal of output signals of the first, second and third amplifiers to the load from the other end; and
a control unit configured to set operation classes of the first, second and third amplifiers and supply a control signal for controlling the power supply voltage supplied to the first, second and third amplifiers to the power modulator; and
when frequency allocation of the plurality of carrier frequencies is in an intra-band carrier aggregation relationship,
the first amplifier is operated in class B while the second and third amplifiers are operated in class C, and
a predetermined constant voltage is supplied as the power supply voltage from the power modulator to the first, second, and third amplifiers; and
when the frequency allocation of the plurality of carrier frequencies is in an inter-band non-contiguous carrier aggregation relationship,
the first, second, and third amplifiers are operated in class B, and
a voltage proportional to a square root of an output power sum of the first, second, and third amplifiers is supplied as the power supply voltage from the power modulator to the first, second, and third amplifiers.

5. The power amplifier according to claim 1, further comprising a switch circuit connected in parallel to the power modulator,
wherein when the frequency allocation of the plurality of carrier frequencies is in the intra-band carrier aggregation relationship, the control unit turns the switch circuit ON.

6. The power amplifier according to claim 1, further comprising a third matching circuit configured to convert output impedance of the power amplifier to a desired value corresponding to the impedance of the load.

7. A power amplification method includes first and second amplifiers connected in parallel and configured to amplify and output an input signal that includes a plurality of carrier frequencies,
the method executed by a computer, comprising:
when frequency allocation of the plurality of carrier frequencies is in an intra-band carrier aggregation relationship,
operating the first amplifier in class B while operating the second amplifier in class C, and
supplying a predetermined constant voltage as a power supply voltage from a power modulator to the first and second amplifiers, thereby operating the first and second amplifiers as Doherty-type power amplifiers; and
when the frequency allocation of the plurality of carrier frequencies is in an inter-band non-contiguous carrier aggregation relationship,
operating the first and second amplifiers in class B, and
supplying a voltage proportional to an amplitude component of the input signal as the power supply voltage from the power modulator to the first and second amplifiers, thereby operating the first and second amplifiers as power amplifiers based on an Envelope Tracking system.

8. A power amplification method includes first, second, and third amplifiers connected in parallel and configured to amplify and output an input signal that includes a plurality of carrier frequencies,
the method executed by a computer, comprising:
when frequency allocation of the plurality of carrier frequencies is in an intra-band carrier aggregation relationship,
operating the first amplifier in class B while operating the second and third amplifiers in class C, and
supplying a predetermined constant voltage as a power supply voltage from a power modulator to the first, second and third amplifiers, thereby operating the first, second and third amplifiers as Doherty-type power amplifiers; and
when the frequency allocation of the plurality of carrier frequencies is in an inter-band non-contiguous carrier aggregation relationship,
operating the first, second, and third amplifiers in class B, and
supplying a voltage proportional to an amplitude component of the input signal as the power supply voltage from the power modulator to the first, second, and third amplifiers, thereby operating the first, second and third amplifiers as power amplifiers based on an Envelope Tracking system.

9. The power amplifier according to claim 3, further comprising a switch circuit connected in parallel to the power modulator,
wherein when the frequency allocation of the plurality of carrier frequencies is in the intra-band carrier aggregation relationship, the control unit turns the switch circuit ON.

10. The power amplifier according to claim 3, further comprising a third matching circuit configured to convert output impedance of the power amplifier to a desired value corresponding to the impedance of the load.

11. The power amplifier according to claim 2, further comprising a switch circuit connected in parallel to the power modulator, wherein when the frequency allocation of the plurality of carrier frequencies is in the intra-band carrier aggregation relationship, the control unit turns the switch circuit ON.

12. The power amplifier according to claim 2, further comprising a third matching circuit configured to convert output impedance of the power amplifier to a desired value corresponding to the impedance of the load.

13. The power amplifier according to claim 4, further comprising a switch circuit connected in parallel to the power modulator, wherein when the frequency allocation of the plurality of carrier frequencies is in the intra-band carrier aggregation relationship, the control unit turns the switch circuit ON.

14. The power amplifier according to claim 4, further comprising a third matching circuit configured to convert output impedance of the power amplifier to a desired value corresponding to the impedance of the load.

* * * * *

UNITED STATES PATENT AND TRADEMARK OFFICE
CERTIFICATE OF CORRECTION

PATENT NO. : 9,531,327 B2
APPLICATION NO. : 14/434137
DATED : December 27, 2016
INVENTOR(S) : Kazuaki Kunihiro Page 1 of 1

It is certified that error appears in the above-identified patent and that said Letters Patent is hereby corrected as shown below:

In the Specification

Column 2, Line 43:
"X/4 (X" has been replaced with --$\lambda$/4 ($\lambda$--;

Column 3, Line 5:
"Pmax" has been replaced with --$P_{max}$--;

Column 8, Formula (1), Line 49:
"$V(t)=a_1(t)\cos[2\pi f_1+\theta_1(t)]+a_2(t)\cos[2\pi f_{21}+\theta_2(t)]$" has been replaced with
--$V(t)=a_1(t)\cos[2\pi f_1+\theta_1(t)]+a_2(t)\cos[2\pi f_2+\theta_2(t)]$--;

Column 10, Line 57:
"fBB=20" has been replaced with --$f_{BB}$=20--.

Signed and Sealed this
Sixth Day of March, 2018

Andrei Iancu
*Director of the United States Patent and Trademark Office*